United States Patent

Uchida et al.

[11] Patent Number: 6,051,858
[45] Date of Patent: Apr. 18, 2000

[54] FERROELECTRIC/HIGH DIELECTRIC CONSTANT INTEGRATED CIRCUIT AND METHOD OF FABRICATING SAME

[75] Inventors: Hiroto Uchida; Nobuyuki Soyama, both of Colorado Springs, Colo.; Katsumi Ogi, Saitama, Japan; Michael C. Scott, New South Wales, Australia; Joseph D. Cuchiaro, Colorado Springs, Colo.; Larry D. McMillan, Colorado Springs, Colo.; Carlos A. Paz de Araujo, Colorado Springs, Colo.

[73] Assignees: Symetrix Corporation, Colorado Springs, Colo.; Mitsubishi Materials Corporation, Japan

[21] Appl. No.: 08/892,699

[22] Filed: Jul. 15, 1997

Related U.S. Application Data

[63] Continuation-in-part of application No. 08/687,721, Jul. 26, 1996.

[51] Int. Cl.[7] .......................... H01L 29/76; H01L 27/108
[52] U.S. Cl. ............................. 257/295; 257/296
[58] Field of Search ................. 257/295, 296; 427/533; 106/287.18

[56] References Cited

U.S. PATENT DOCUMENTS

| | | | |
|---|---|---|---|
| 5,371,700 | 12/1994 | Hamada | 257/295 |
| 5,541,807 | 7/1996 | Evans, Jr. et al. | 257/295 |
| 5,605,723 | 2/1997 | Ogi et al. | 427/533 |
| 5,630,872 | 5/1997 | Ogi et al. | 106/287.18 |
| 5,654,567 | 8/1997 | Numata et al. | 257/295 |
| 5,760,433 | 6/1998 | Ramer et al. | 257/295 |
| 5,986,301 | 11/1999 | Fukushima et al. | 257/295 |

OTHER PUBLICATIONS

"The Physics of Ferroelectric Memories" by Auciello et al, pp. 22–27, Physics Today, vol. 51, No. 7, Jul. 1998.

*Primary Examiner*—Steven H. Loke
*Attorney, Agent, or Firm*—Duft, Graziano & Forest, P.C.

[57] ABSTRACT

A transistor on a silicon substrate is covered by an insulating layer. A conducting plug passes through the insulating layer to the transistor drain. The bottom electrode of a ferroelectric capacitor that directly overlies the plug and drain contacts the plug. The ferroelectric layer is self-patterned and completely overlies the memory cell. A self-patterned sacrificial layer completely overlies the ferroelectric layer. The bottom electrode of the capacitor is completely enclosed by the ferroelectric layer, the insulating layer, and the conducting plug. The sacrificial layer comprises either: a) a metal selected from a first metal group consisting of tantalum, hafnium, tungsten, niobium and zirconium; or b) a metallic compound comprising one or more metals selected from a second group of metals consisting of titanium, tantalum, hafnium, tungsten, niobium and zirconium compounded with one or more metals from a third group of metals consisting of strontium, calcium, barium, bismuth, cadmium, and lead, such as strontium tantalate, tantalum oxide, bismuth deficient strontium bismuth tantalate, strontium titanate, strontium zirconate, strontium niobate, tantalum nitride, and tantalum oxynitride.

10 Claims, 13 Drawing Sheets

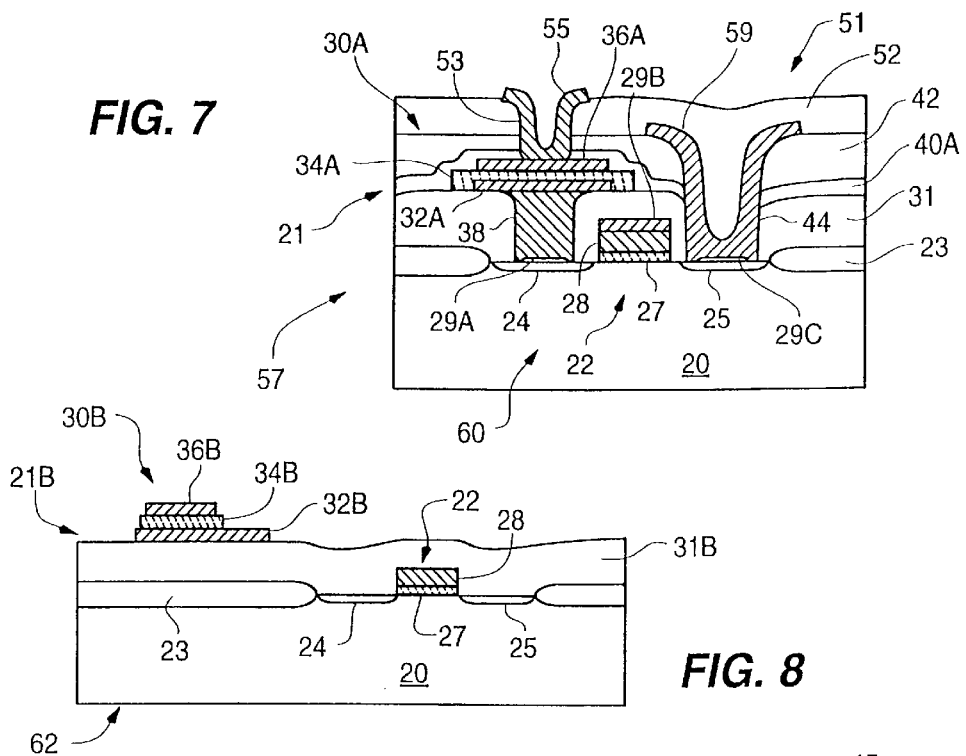
FIG. 7
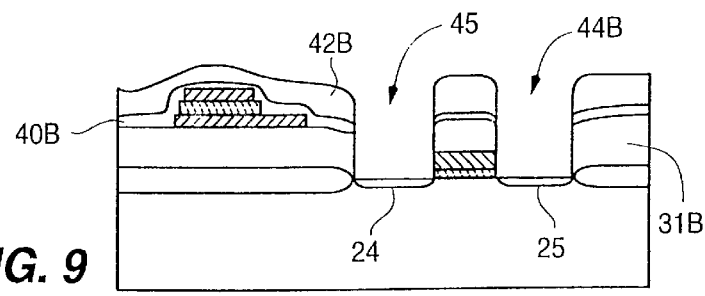
FIG. 8
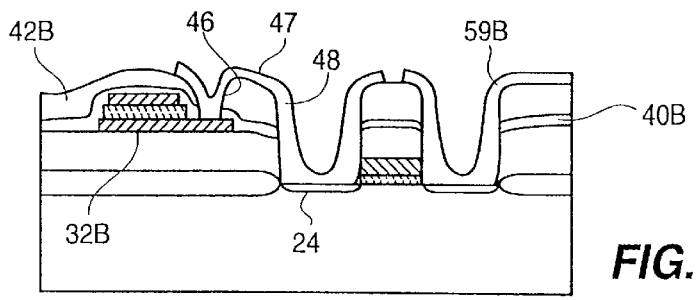
FIG. 9
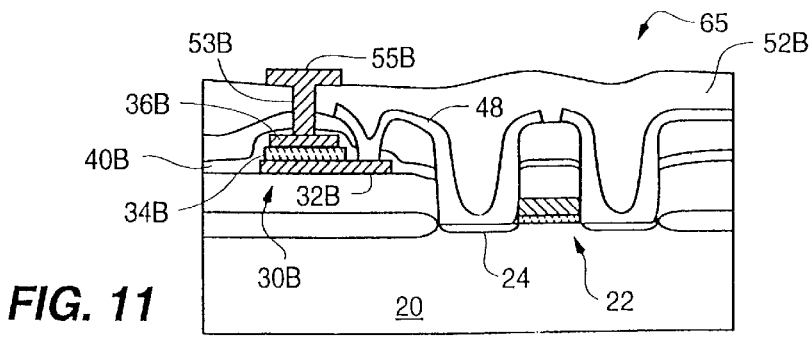
FIG. 10
FIG. 11

FERROELECTRIC/HIGH DIELECTRIC CONSTANT INTEGRATED CIRCUIT AND METHOD OF FABRICATING SAME

This application is a continuation-in-part of U.S. patent application Ser. No. 08/687,721 filed Jul. 26, 1996, now allowed.

BACKGROUND OF THE INVENTION

1. Field of the Invention

The invention relates to the structure and fabrication of integrated circuits, particularly those which utilize ferroelectric and/or high dielectric constant thin films.

2. Statement of the Problem

As is well-known, integrated circuits (ICs) are fabricated by layering and patterning thin films on a substrate, such as a thin slice of a single crystal of silicon or gallium arsenide. The patterning process is a complicated and expensive one that normally requires the application of a photo resist layer, exposure of the resist through a mask to define the device pattern, etching to remove portions of the thin film materials, and removal of the remaining resist in a solvent wash.

It is also well-known that ferroelectric materials, particularly lead zirconium titanate (PZT) are useful in integrated circuits. See, for example, U.S. Pat. No. 5,046,043 issued Sep. 3, 1991 to William D. Miller et al. Recently, a new class of materials, called layered superlattice materials, have been found to be far superior to PZT for ferroelectric uses and U.S. Pat. No. 5,519,234 issued May 21, 1996 to Carlos A. Paz De Araujo et al. These materials are more complex than PZT; while PZT is a solid solution of two $ABO_3$ type perovskites, layered superlattice materials are materials that spontaneously form complex crystal structures having collated intergrowth layers. Thus, they are more difficult to form than PZT and are more susceptible to damage by conventional integrated circuit processing.

It is known that some materials, such as PZT, may be self-patterned, thereby eliminating the need for some of the photo-resist and etching steps. See, Yuichi Nakao, et. al., *Micro-Patterning of $PbZr_xT_{1-x}O_3$ Thin Films Prepared by Photo Sensitive Sol-Gel Solutions*, Jpn. J. Appl. Phs. Vol. 32, Part 1, No. 9B, pp. 4141–4143, September 1993 and Soyama et al., *The Formation of a Fine-Patterned Ferroelectric Thin-Film From a Sol-Gel Solution Containing a Photo-Sensitive Water Generator,* Proceedings Of The International Symposium On Applied Ferroelectrics (1994).

While the materials, structures, and processes discussed in the above references are significant advances, these advances have lead to serious new problems related to the integration of the ferroelectric materials, in particular the layered superlattice materials, and the self-patterning processes into conventional CMOS integrated circuit technology. See for example, H. Achard and H. Mace, "Integration of Ferroelectric Thin Films For Memory Applications", in O. Auciello and R. Waser (eds.), *Science and Technology of Electroceramic Thin Films,* pp. 353–372, 1995, Kiuwer Academic Publishers, Netherlands, which discusses the problem of etching a nonconformal coating deposited by the sol-gel method (pp. 358–360) for which there is no process window and the difficulties in the "back-end" stages of processing (p. 367). The conventional process in which the three layers of the ferroelectric capacitor are etched in a single mask and etch process has been found to result in leakage between the top and bottom electrodes of the capacitor. The conventional hydrogen forming gas reduction back-end process, which is essential to CMOS integrated circuits, has been found to be quite destructive of ferroelectric materials; particularly the layered superlattice materials. See for example, Takashi Hase, Takehiro Noguchi and Yoichi Miyasaka, "Analysis of the Degradation of PZT and $SrBi_2Ta_2O_9$ Thin Films With A Reductive Process", in *Abstracts of the 8th International Symposium on Integrated Ferroelectrics,* Mar. 18–20, 1996, p. 11 c. A 1 transistor-1 capacitor ferroelectric memory cell structure having a ferroelectric capacitor in which the ferroelectric material covers one end of the bottom electrode and extends out beyond the top electrode at the other end to solve the leakage problem, and includes a titanium oxide ($TiO_2$) reaction barrier layer overlying the ferroelectric capacitor to solve the problem of the reduction of the ferroelectric by the hydrogen forming gas has been attempted. See, Iisub Chung, Chang Jung Kim, Chee Won Chung, and In Keong Yoo, "Integration of Ferroelectric Capacitors Using Multilayered Electrode", in *The Tenth International Symposium on the Applications of Ferroelectrics,* Aug. 18–21, 1996, p.55. However, the titanium in this protective layer can itself lead to new problems in the integrated circuit. In addition, the proposed memory structure is relatively large, and thus does not lend itself to dense, economical integrated circuits. Thus, it would be highly desirable to have integrated circuit materials, structures, and processes that solve the capacitor leakage and back-end process problems, were compatible with important ferroelectric materials, permit the use of self-patterning materials in integrated circuits, and/or which result in a more dense memory cell structure and a more economical memory cell fabrication process.

SUMMARY OF THE INVENTION

The invention solves the above problems by providing new materials for a protective layer that overlies the ferroelectric/high dielectric constant elements in the integrated circuit. Preferably the protective layer comprises a compound of one or more metals with oxygen and/or nitrogen. Preferably, the metal is selected from a first metal group consisting of tantalum, hafnium, tungsten, niobium and zirconium. In some embodiments one or more metals selected from a second group of metals consisting of titanium, tantalum, hafnium, tungsten, niobium and zirconium is compounded with one or more metals from a third group of metals consisting of strontium, calcium, barium, bismuth, cadmium, and lead. Examples of such compounds are strontium tantalate ($SrTaO_3$), tantalum oxide ($Ta_2O_5$), bismuth deficient strontium bismuth tantalate, i.e. $SrBi_xTa_2O_9$ where x<2, strontium titanate, strontium zirconate, strontium niobate, tantalum nitride, tantalum oxynitride etc. Preferably, the protective layer functions as a sacrificial layer. That is, the protective layer, particularly the outer portion, is reduced by the forming gas and in this manner sacrificed. Since the layer is not an active element, that is, it does not alter its electronic state during the operation of the device, the fact that it is sacrificed does not affect the electrical performance of the integrated circuit.

The invention also solves the above problems by providing simplified processes for fabricating the protective layer, such as processes that employ self-patterning metal/oxygen/nitrogen compounds.

The invention additionally solves the above problems by providing improved and simplified integrated circuit memory cell structures, including one in which a ferroelectric/high dielectric constant capacitor is formed directly over one of the transistor active areas and is connected to the active area via a poly plug. Preferably, the ferroelectric/high dielectric constant layer overlies the bottom electrode of the capacitor on both ends, and a penetration of the protective layer near a step in the protective layer is eliminated, eliminating a weak point in the protection of the ferroelectric/high dielectric constant material from the forming gas.

The invention further solves the above problems by using a misted deposition process for depositing the protective layer and/or the ferroelectric/high dielectric constant layer, which overcomes the etching problems associated with previous liquid deposition processes which were significantly non-conformal.

The invention provides a ferroelectric integrated circuit comprising: a semiconducting substrate defining a substrate plane; a transistor formed on the substrate, the transistor including an active area and a transistor gate; an insulating layer overlying the transistor gate; a conducting plug passing through the insulating layer to the active area and extending above the transistor gate; a ferroelectric device, the ferroelectric device making electrical contact with the conducting plug and completely overlying both the conducting plug and the active area; a protective sacrificial layer completely overlying the ferroelectric device; and a wiring element passing through the protective layer and making electrical contact with the ferroelectric device. Preferably, the ferroelectric device includes a ferroelectric layer that completely underlies the protective sacrificial layer. Preferably, the ferroelectric device comprises a ferroelectric capacitor having a bottom electrode, a top electrode, and a ferroelectric material between the electrodes, and wherein the bottom electrode is enclosed by the ferroelectric layer, the insulating layer, and the conducting plug. Preferably, the integrated circuit includes a memory cell and the protective sacrificial layer completely overlies the memory cell.

The invention also provides a ferroelectric integrated circuit comprising: a semiconducting substrate defining a substrate plane; a memory cell formed on the substrate, the memory cell comprising a transistor and a ferroelectric device; the transistor including an active area; a ferroelectric device, the ferroelectric device including a ferroelectric layer that completely overlies the transistor, and a wiring element passing through the ferroelectric layer and making electrical contact with the active area. Preferably, the ferroelectric integrated circuit further includes a protective sacrificial layer completely overlying the ferroelectric layer.

In another aspect the invention provides a ferroelectric integrated circuit comprising: a semiconducting substrate defining a substrate plane; a transistor formed on the substrate, the transistor including an active area and a transistor gate; an insulating layer overlying the transistor gate; a conducting plug passing through the insulating layer to the active area and extending above the transistor gate; and a ferroelectric capacitor having a bottom electrode, a top electrode, and a ferroelectric material between the electrodes, wherein the bottom electrode is enclosed by the ferroelectric layer, the insulating layer, and the conducting plug. Preferably, the ferroelectric material completely overlies the active area.

In a further aspect, the invention provides a ferroelectric integrated circuit comprising a ferroelectric device and a protective sacrificial layer overlying the ferroelectric device, the protective sacrificial layer comprising a material selected from the group consisting of: a) a metallic compound comprising a metal selected from a first metal group consisting of tantalum, hafnium, tungsten, niobium and zirconium; b) a metallic compound comprising one or more metals selected from a second group of metals consisting of titanium, tantalum, hafnium, tungsten, niobium and zirconium compounded with one or more metals from a third group of metals consisting of strontium, calcium, barium, bismuth, cadmium, and lead. Preferably, the material comprises a compound selected from the group consisting of strontium tantalate, tantalum oxide, bismuth deficient strontium bismuth tantalate, strontium titanate, strontium zirconate, strontium niobate, tantalum nitride, and tantalum oxynitride. Preferably, the material is a self-patterned material. Preferably, the ferroelectric integrated circuit further includes a wiring element passing through the protective layer and making electrical contact with the ferroelectric device.

In still a further aspect the invention provides a ferroelectric integrated circuit comprising a ferroelectric device and a protective sacrificial layer overlying the ferroelectric device, the protective sacrificial layer comprising a self-patterned material. Preferably, the protective sacrificial layer completely overlies the ferroelectric device. Preferably, the integrated circuit further includes a wiring element passing through the protective layer and making electrical contact with the ferroelectric device.

The invention also provides a method of fabricating an integrated circuit comprising the steps of: providing a substrate; providing a photosensitive liquid solution including one or more elements in appropriate amounts for forming a protective sacrificial material upon applying the photosensitive liquid solution to the substrate to form a thin film, exposure of the thin film to radiation, development of the thin film, and treating of the film to form a solid material; forming an electronic device on the substrate; applying the photosensitive liquid solution to the substrate to form a thin film of the photosensitive liquid solution on the substrate; patterning the thin film through exposure of the first film to radiation and subsequent development; and treating of the thin film to form a first solid film of the protective sacrificial material overlying the electronic device. Preferably, the protective sacrificial material comprises a material selected from the group consisting of a) a metallic compound comprising a metal selected from a first metal group consisting of tantalum, hafnium, tungsten, niobium and zirconium; b) a metallic compound comprising one or more metals selected from a second group of metals consisting of titanium, tantalum, hafnium, tungsten, niobium and zirconium compounded with one or more metals from a third group of metals consisting of strontium, calcium, barium, bismuth, cadmium, and lead. Preferably, the material comprises a compound selected from the group consisting of strontium tantalate, tantalum oxide, bismuth deficient strontium bismuth tantalate, strontium titanate, strontium zirconate, strontium niobate, tantalum nitride, and tantalum oxynitride. Preferably, the electronic device includes a material selected from the group consisting of ferroelectric materials and high dielectric constant materials.

The invention also provides a method of fabricating an integrated circuit comprising the steps of: providing a substrate; providing a photosensitive liquid solution including one or more elements in appropriate amounts for forming a material selected from the group consisting of strontium tantalate, tantalum oxide, bismuth deficient strontium bismuth tantalate, strontium titanate, strontium zirconate, strontium niobate, tantalum nitride, and tantalum oxynitride upon applying the photosensitive liquid solution to the substrate to form a thin film, exposure of the thin film to radiation, development of the thin film, and treating of the film to form a solid material; applying the photosensitive liquid solution to the substrate to form a thin film of the photosensitive liquid solution on the substrate; patterning the thin film through exposure of the first film to radiation and subsequent development; and treating of the thin film to form a first solid film of the material.

In a further aspect, the invention provides a method of fabricating an integrated circuit comprising: providing a substrate; forming an insulating layer on the substrate; forming a hole in the insulating layer, depositing a layer of platinum on the insulating layer and in the hole; utilizing a chemical mechanical polishing (CMP) method to remove the platinum from the insulating layer while leaving at least a portion of the platinum in the hole. Preferably, the insulating layer comprises a material selected from the group consisting of silicon dioxide, spin-on-glass, and silicon nitride. Preferably, the platinum remaining after the CMP method comprises the top electrode of a capacitor.

In still a further aspect, the invention provides a method of making an integrated circuit comprising: providing a substrate defining a substrate plane; forming a first electrode on the substrate; forming an insulating layer on the electrode and substrate; patterning the insulating layer to open a hole to the first electrode while leaving a portion of the insulating layer overlying the first electrode on at least two sides; depositing a metal oxide layer on the first electrode and the insulating layer; self-patterning the metal oxide layer while leaving a portion of the metal oxide overlying the insulating layer directly above the portion of the insulating layer overlying the first electrode on both of the sides; forming a second electrode on the metal-oxide layer; patterning the second electrode so that the outer edge of the metal oxide layer does not underlie the second electrode on the two sides. Preferably, there are two of the capacitors adjacent to one another, and the method further includes the step of forming a second insulating layer and patterning the second insulating layer to form holes to the second electrode while leaving a portion of the second insulating layer overlying the outer edge of the second electrode of each of the capacitors. Preferably, the method further includes the step of forming two pairs of the capacitors and a pair of transistors between the capacitor pairs along a direction parallel to the substrate plane. Preferably, each pair of the transistors include three active areas, one of which is common to both transistors, and further including the step of electrically connecting the not common active area of each transistor to the top electrode of the one of the capacitors adjacent the transistor.

The invention not only solves the leakage and back-end process problems in the prior art while providing a denser memory cell, but also simplifies the fabrication process in that the new protective layer materials are self-patterning materials. Numerous other features, objects and advantages of the invention will become apparent from the following description when read in conjunction with the accompanying drawings.

BRIEF DESCRIPTION OF THE DRAWING

FIG. 7 is a cross-sectional view of an alternative preferred embodiment of an integrated circuit memory cell according to the invention;

FIGS. 8–11 are cross-sectional views of an alternative embodiment of an integrated circuit memory cell according to the invention showing progressive stages in the preferred fabrication method of this embodiment according to the invention;

DETAILED DESCRIPTION OF THE PREFERRED EMBODIMENT

1. Overview and Integrated Circuit Structure

Figure 1:
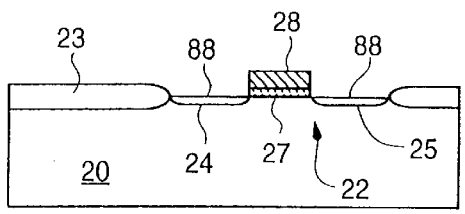
FIGS. 1–5 are cross-sectional views of the preferred embodiment of an integrated circuit memory cell according to the invention showing progressive stages in the preferred fabrication method of this embodiment according to the invention.

FIGS. 1–5, 7–14, 16–21, 23–29, and 31–51, and 53–57 illustrate portions 50 (FIG. 5), 60 (FIG. 7), 64 (FIG.

11), 70 (FIG. 14) etc. of integrated circuits as may be fabricated using the method of the invention. It should be understood that the figures depicting integrated circuit portions in various stages of fabrication, are not meant to be actual cross-sectional views of an actual integrated circuit, but are merely idealized representations which are employed to more dearly and fully depict the structure and process of the invention than would otherwise be possible. For example, in actual integrated circuit devices the relative thickness of the various layers is such that if the layers were shown in actual relative proportions, an entire memory cell could not fit on a page; as another example, in actual devices, the layers may not be sharply contoured as in the layers shown. The particular integrated circuit portions 50, 60, 64, and 70 shown in FIGS. 5, 7, 11 and 14, respectively, represent a single memory cell 51, 61, 65, and 71 respectively, of a IT/IC (one transistor/one capacitor) FeRAM or DRAM that is a well-known integrated circuit in the art. As is known in the art, if the material 34, 34A, 34B, and 34D is a dielectric material, the cell is commonly called a DRAM cell, while if the material 34, 34A, 34B, and 34D is a ferroelectric material, the cell is commonly called an FeRAM cell. In the embodiments shown herein, the material 34, 34A, 34B and 34D is preferably a ferroelectric material or a high dielectric constant material such as barium strontium titanate (BST) in a non-ferroelectric phase, though the invention may be applied to other materials. In this disclosure, "high dielectric constant" means, preferably, a dielectric constant greater than or equal to 20, and, most preferably, greater than or equal to 50. In this specification we shall refer to material 34, 34A etc. as a ferroelectric/dielectric material to indicate that it can be either or both. As is well-known in the art, integrated circuits, such as 50, 60, 64, and 70 etc. are generally made on a wafer 10, 57, 62, 68, which is subsequently sawed into hundreds of individual integrated circuit chips, each chip containing thousands or millions of memory cells 51, 61, 65, and 71 etc. Each chip is then packaged to produce the finished integrated circuit product. It should be understood that the term "wafer" as used herein refers to the chip in various stages of fabrication; that is the wafers 10, 57, 62, 66, 68 etc. of the various embodiments of the invention change as successive layers are built up and patterned.

Figure 2:
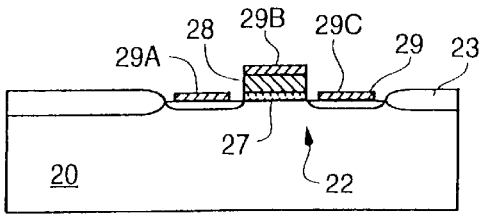

FIGS. 1 through 5 are cross-sectional views of a wafer 10 on which is formed an integrated circuit memory cell according to the invention showing progressive stages in one of the preferred fabrication methods according to the invention. As known in the art, the memory cell 51 (FIG. 5) is fabricated on an underlying substrate 20 that may be silicon, gallium arsenide, glass, ruby or other conventional substrate material known in the art. In the embodiments described below underlying substrate 20 is a single crystal n-type silicon wafer 20. It should be understood that the term "substrate" is often used ambiguously in the art of integrated circuits. Often, it is used to refer to the silicon, gallium arsenide or other wafer, such as 20 in FIG. 1 on which the integrated circuit is fabricated. We have referred to these as the "underlying substrates" above. At other times the term is used to refer to the incomplete portion of the integrated circuit on which a particular layer is formed. For example, in this sense, the "substrate" 21 on which material 34 in FIG. 1 is formed is in general terms the bottom electrode 32, dielectric layer 31, and all the layers under them. At still other times the word "substrate" is used to mean the immediate layer on which a material is formed. In this sense the bottom electrode 32 and dielectric layer 31 comprise the immediate substrate on which layer 34 is formed. In this specification, the term "substrate" is used broadly to mean any layer on which a particular layer of interest is formed. Continuing with the description of FIG. 1, a field oxide layer 23 is grown on the silicon substrate 20, and a transistor 22 is fabricated by depositing a thin gate oxide 27, preferably silicon dioxide, and a gate electrode (word line) 28, preferably polysilicon, and forming doped active areas 24 and 25, preferably a p-type dopant, all in a conventional manner. Then, as shown in FIG. 2, a thin layer 29 of titanium silicide ($TiSi_2$) is then deposited and patterned in a self-patterning process as discussed below, or alternatively, by a conventional mask and etch process or other conventional process to form ohmic contacts 29A, 29B, and 29C, respectively.

Figure 3:
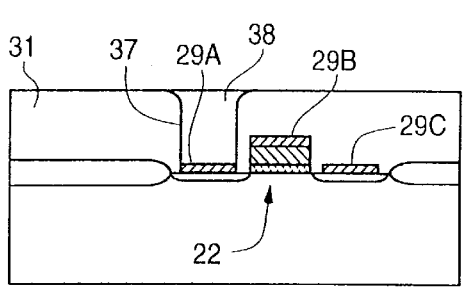

Turning to FIG. 3, an interlayer dielectric 31 is then deposited, which is preferably spin-on-glass (SOG) or other insulating material. It should be noted that some layers, such as interlayer dielectric 31 and wiring layers 55 and 59 may be multilayered elements, but are not shown and the processes of making them not described in complete detail herein because these details do not directly relate to the invention. For details of layer 31 and other layers and processes of formation thereof which are not described in detail herein or described by reference to other specific publications, we refer to U.S. Pat. No. 5,468,684 issued Nov. 21, 1995, which is hereby incorporated by reference. A well 37 is then formed in interlayer dielectric 31, by a photomask and etch process, with the titanium silicide acting as an etch stop, or other conventional method. A thick layer of polysilicon is then deposited and cut down to the plane of the interlayer dielectric via a chemical mechanical polishing (CMP) process, as known in the art, to form polysilicon plug 38. Plug 38 may alternatively be formed of tungsten or other conductive material as known in the art.

Figure 4:
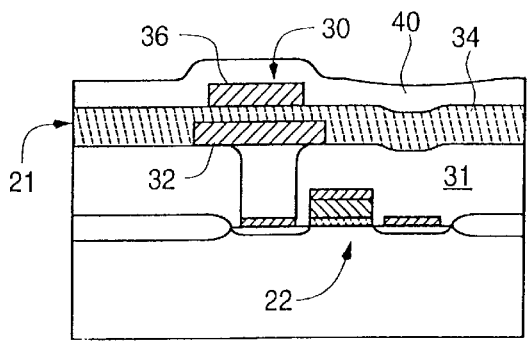
Figure 6:
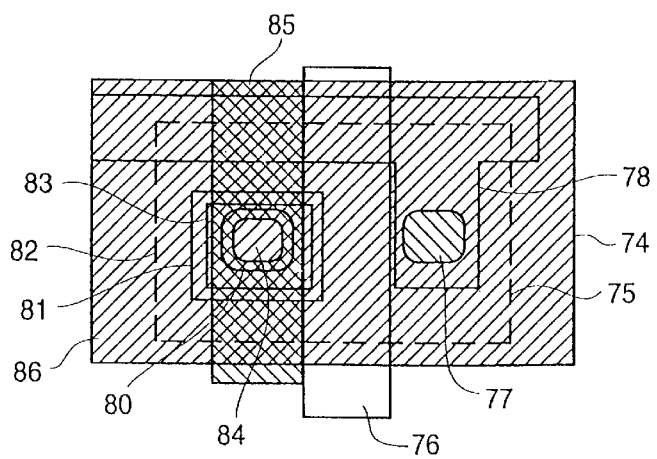
FIG. 6 is a layout of the masks used in fabrication of the integrated circuit of FIG. 5.

As shown in FIG. 4, a capacitor 30 is then formed on insulating layer 31 and plug 38. The preferred processes for fabricating capacitor 30 are described in detail below, but a brief overview will be given here. Capacitor 30 includes a bottom electrode 32, a ferroelectric/dielectric layer 34, and a top electrode 36. Bottom electrode 32 is preferably a thin, approximately 200 Å thick, adhesion layer of titanium and an approximately 2000 Å thick layer of platinum, both preferably formed by sputtering. Layer 34 is a ferroelectric or high dielectric constant material, the exact nature of which will depend upon the application. Layer 34 extends over the entirety of the memory cell area 74 (FIG. 6). This simplifies the process of fabricating the integrated circuit, since a mask and a sequence of patterning steps may be omitted, or, if the layer 34 is specifically patterned, the patterning is done in an area of the integrated circuit which is surrounded by insulator and in which no critical parts are located, and thus it can be done with much greater tolerances, which also simplifies the overall process. Since this patterning is done far from the capacitor, it ensures that the patterning steps will not result in leakage of the capacitor. Since the layer 34, in the preferred embodiment is a material having a high dielectric constant, not performing a patterning sequence specifically for it and permitting it to cover the whole of the memory cell area 74 (except where it is penetrated by subsequently formed holes, such as 44,) does not essentially change the character of the memory cell 51. At the same time, extending the layer 34 across the entire cell 51 adds an additional insulating and protective layer that prevents shorting of the capacitor and protects the layers below it. Preferred materials for the layer 34 are $ABO_3$ type materials, such as PZT or BST, layered superlattice materials, such as strontium bismuth tantalate or lead bismuth titanate and many other known ferroelectrics or high dielectric constant materials. The formation of layer 34 comprises an important aspect of the invention and thus will be given in detail below. Layer 34 is preferably formed by depositing a liquid precursor and treating it to form a solid film. The deposition is preferably by a misted deposition process as described in U.S. Pat. No. 5,456,945 issued Oct. 10, 1995, which is hereby incorporated by reference the same as though fully disclosed herein. However, it may be by a spin-on or other deposition process. The treating preferably includes drying, rapid thermal anneal (RTA) and/or furnace anneal. Layer 34 is preferably formed of a self-patterning material, as described below, or it may be formed of a material that is patterned in a conventional mask and etch patterning process, for example as described in U.S. Pat. No. 5,519,234 issued May 21, 1996 which is hereby incorporated by reference as though fully disclosed herein. Top electrode 36 is preferably an approximately 2000 Å thick layer of platinum, preferably formed by sputtering. As indicated in the figure, layer 34 is slightly wider than top electrode 36 to prevent leakage. Layer 34 is referred to herein as the "active" layer, to distinguish it from other dielectric layers in the integrated structure, in that it and electrodes 32 and 36 form an electronic component the electronic state of which changes its electronic state during operation of the integrated circuit. This is in contrast to other dielectric layers, such as interlayer dielectric 31, which do not change electronic state during the operation of the integrated circuit. Protective layer 40 is then deposited on the wafer 10. Protective layer comprises a compound of a one or more metals with oxygen and/or nitrogen. Preferably, the metal is selected from a first metal group consisting of tantalum, hafnium, tungsten, niobium and zirconium. In some embodiments one or more metals selected from a second group consisting of titanium, tantalum, hafnium, tungsten, niobium and zirconium is compounded with one or more metals from a third group of metals consisting of strontium, calcium, barium, bismuth, cadmium, and lead. Examples of such compounds are strontium tantalate ($SrTaO_3$), tantalum oxide ($Ta_2O_5$), bismuth deficient strontium bismuth tantalate, i.e. $SrBi_xTa_2O_9$ where x<2, strontium titanate, strontium zirconate, strontium niobate, tantalum nitride, tantalum oxynitride etc. This protective layer 40 also is an important aspect of the invention and therefore the details of the formation of this layer will be discussed below.

Figure 5:
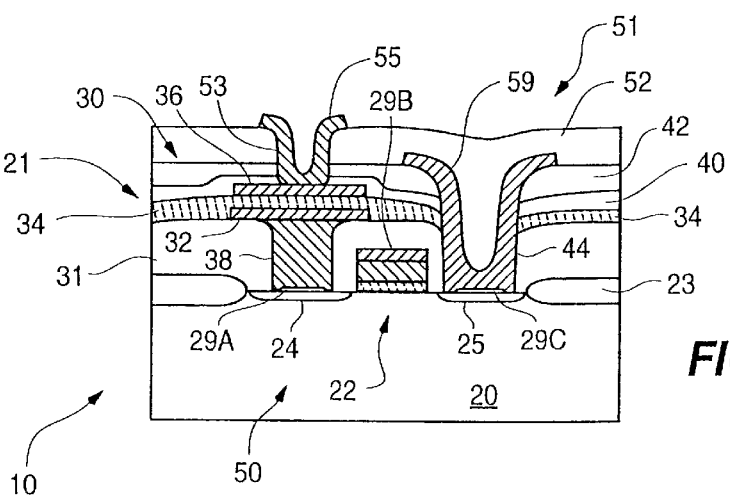

Turning to FIG. 5, another interlayer dielectric layer 42 is deposited. Like layer 31, this is also preferably SOG, but may be any other suitable dielectric material. This is followed by a second CMP process, and then the formation of well 44, again by a photo/mask/etch or other conventional process. A first metalization deposition is then carried out and patterned, again in a conventional manner, to form the wiring connection (bit line) 59 to the active area 25. A third interlayer dielectric 52 is then deposited. This is preferably a TEOS layer formed by chemical vapor deposition (CVD) but may be SOG or any other suitable dielectric material formed by a suitable method. Another well 53 is formed, again by a photo/mask/etch or other conventional process. Then a second metalization layer is deposited and patterned, again by conventional methods, to form wiring connection (plate line) 55 to the top electrode 36 of capacitor 30. The integrated circuit is then completed and packaged as known in the art.

FIG. 6 is a layout showing the relative sizes and positions of the most important masks used in fabricating the integrated circuit of FIG. 5. Dotted line 74 outlines the area of the memory cell 51 and dotted line 75 defines the area of transistor 22. Mask 76 defines the word line 28, mask 77 defines the well 44, mask 78 defines the bit line 59, mask 80 defines the well 37, mask 81 defines the bottom electrode 32, mask 82 defines the active layer 34, mask 83 defines the top electrode 36, mask 84 defines the well 53, and mask 85 defines plate line 55. As indicated by the hatching, layer 34 covers the whole cell area 74 except where it is penetrated by well 44.

FIG. 7 shows an alternative preferred embodiment of an integrated circuit memory cell 61 according to the invention. In FIG. 7 and subsequent figures, elements that are essentially identical to the same elements in FIGS. 1–6 are given the same number. Elements that play a similar role though changed, are usually given the same number with a letter suffix; for example the capacitor is indicated by "3A" rather than "30". The embodiment of FIG. 7 is the same as the embodiment of FIG. 5 except that the active layer 34A is pattered in a self-patterning process described below. The patterning is preferably done immediately after layer 34A is deposited, though only the development step may be done at this time and the stripping step done after the top electrode 36 is formed at the same time the stripping step associated with the patterning of the top electrode 36 is performed. The self-patterning process of forming this layer 34A will be described in further detail below.

The structure of the integrated circuits shown in FIGS. 5 and 7 is a feature of the invention. To unambiguously define this structure, it is necessary to introduce several terms. In this disclosure the term "substrate plane" means a plane parallel to the surface of the substrate 22, which is the line 88 in FIG. 1. The word "above" is a relative term that is defined with respect to the substrate 22. That is, if a second element is said to be "above" a first element, it means that the second element is further from the substrate plane than the first element in a direction perpendicular to the substrate plane. Similarly, the word "overlying" means that the overlying element is further from the substrate than the underlying element and the "bottom" electrode is closer to the substrate than the "top" electrode of the same device. The words "outer" and "inner" pertain to the horizontal direction; for example, the word "outer edge" when applied to an edge of a patterned integrated circuit layer portion refers to an edge one reaches when passing away from the center of the patterned portion in the horizontal direction in the figures, that is a direction parallel to the substrate plane. It is a feature of the integrated circuit structures shown in FIGS. 5 and 7 that the ferroelectric device 30, 30A, completely overlies both the conducting plug 38 and the active area 24. In this disclosure and the claims, the term "completely overlying" means that the overlying element has a first end that extends away from the center of the overlying element at least up to a line perpendicular to the plane of the substrate 22 and aligned with one end of the underlying element and a second end that extends away from the center of the overlying element in the opposite direction at least up to a line perpendicular to the plane of the substrate 22 and aligned with the other end of the underlying element. Thus, the capacitor 30, 30A completely overlies the active area 24 and the conductive plug 38, and the protective layer 40, 40A completely overlies the capacitor 30, 30A. Similarly, "completely underlying" means that the underlying element has a first end that extends away from the center of the underlying element at least up to a line perpendicular to the plane of the substrate 22 and aligned with one end of the overlying element and a second end that extends away from the center of the underlying element in the opposite direction at least up to a line perpendicular to the plane of the substrate 22 and aligned with the other end of the overlying element. Thus, the ferroelectric layer 34 in FIG. 5 completely underlies the protective layer 40. It should also be understood that as defined above an element can completely overlie another element even though a minor portion of the overlying element is removed to permit an electrical contact to penetrate the overlying element to make contact with the underlying element.

FIGS. 8–11 illustrate an alternative structure of an integrated circuit 64 according to the invention and the process of fabricating such an integrated circuit In this embodiment the field oxide 23 and transistor 22, including active areas 24 and 25, gate oxide 27 and gate 28 are formed on substrate 20 as in the embodiment of FIGS. 1–5. The titanium oxide layer is preferably skipped, though it may be utilized if desired. Interlayer dielectric 31B is deposited as before. Capacitor 30B is then fabricated directly on the interlayer dielectric 31B. The processes in forming capacitor 30B are the same as described above except that the masks used to define the bottom electrode 32B, the active layer 34B, and the top electrode 36B are different. The process for fabricating the active layer 34B may include any of the processes for forming this layer which are described in detail below. In the embodiment shown, the active layer 34B does not completely cover the bottom electrode 32B, but extends a small distance beyond the ends of top electrode 36B so as to prevent shorting. Bottom electrode 32B extends well out beyond the end of both active layer 34B and top electrode 36B to provide a contact area for the wiring connection 48 to the drain active area 24 (FIG. 11).

Turning to FIG. 9, protective/sacrificial layer 40B is formed as before using any one of the processes described below followed by the formation of second ILD layer 42B as described above. Wells 44B and 45 are then formed through both ILD layers 31B and 42B as well as protective layer 40B down to active areas 24 and 25. Then, as shown in FIG. 10, well 46 is formed through interlayer dielectric 42B and sacrificial layer 40B down to bottom electrode 32B, which acts as an etch stop layer. Wells 45 and 46 are preferably not made in the same mask and etch step, since the etch must stop on a different material, though accurate timing of the etch and selection of etchants may permit well 46 to be made during part of the process of making wells 44B and 45. Then, first metalization layer 47 is deposited and patterned, by the same process as described above, except that a different mask is used, to form bit line 59B and wiring connection 48 between the drain active area 24 and bottom electrode 32B. Then third interlayer dielectric layer 52B is formed as above, well 53B is formed through the ILD 52B and protective layer 40B down to top electrode 36B, followed by the deposition and patterning of the second metalization layer to from plate line 55B. In this case, the well 53B is thinner than the well 53, so that the wiring layer 55B forms a solid plug in the well, to illustrate an alternative embodiment of the bit line, though as indicated above, the wider well is preferred as it is more likely to result in a good contact with the top electrode.

Figure 12:
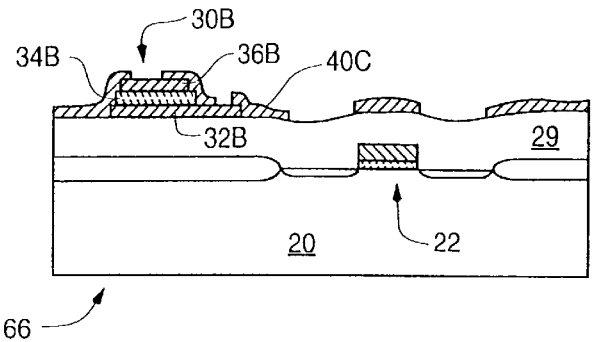
FIG. 12 is a cross-sectional view of a partially completed integrated circuit memory cell according to the invention illustrating the preferred embodiment of the fabrication method of the protective layer according to the invention utilizing the self-patterning properties of the protective layer material.

FIG. 12 illustrates an alternative embodiment of fabricating the protective layer 40C in the context of the embodiment of FIGS. 8–11. In the embodiment of FIG. 12, the protective layer 40C is made with a self-patterning process (described below) and is patterned separately from the third ILD layer 52B. This process permits the protective layer to be patterned with much less reactive washes than the etchants required to pattern SOG and other insulators.

Figure 13:
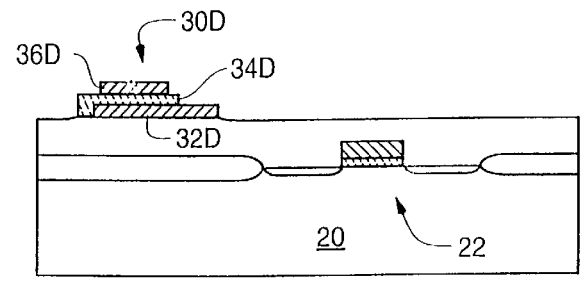
FIGS. 13 and 14 are cross-sectional views of an alternative embodiment of an integrated circuit memory cell according to the invention showing progressive stages in the preferred fabrication method of this embodiment according to the invention.
Figure 14:
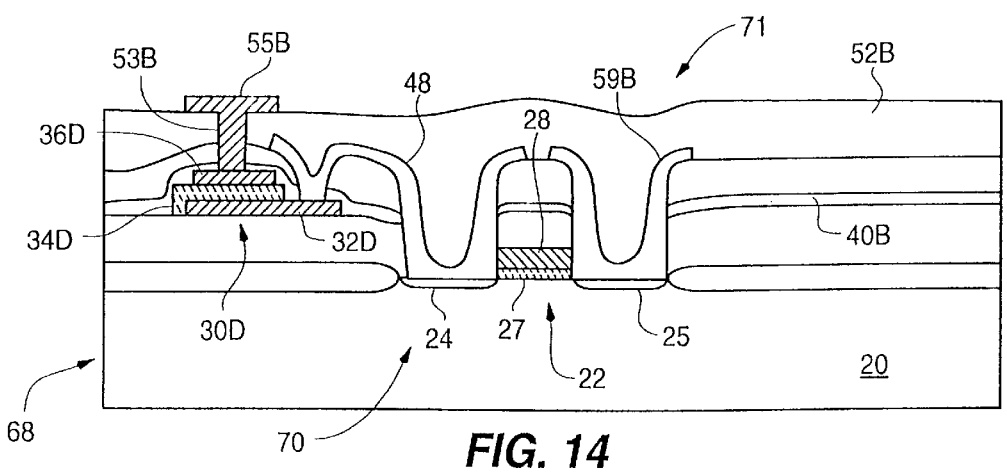
Figure 15:
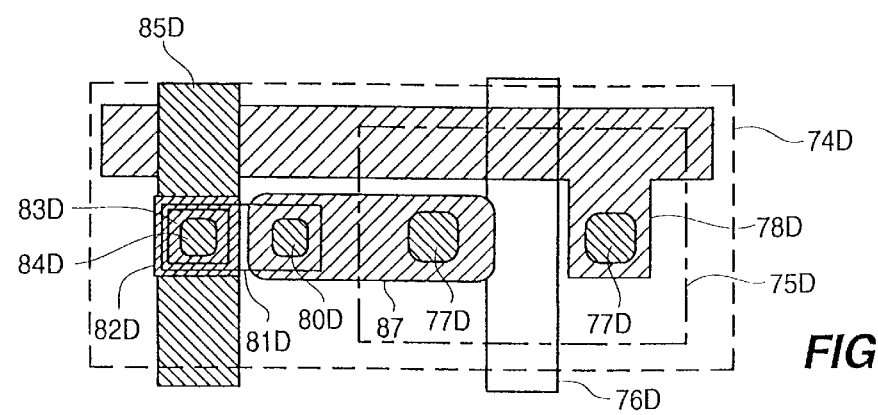
FIG. 15 is a layout of the masks used in fabrication of the integrated circuit of FIG. 14.

FIGS. 13–15 illustrate a further variation of the structure and process of FIGS. 8–11. In this embodiment the active layer 34D of capacitor 30D is patterned to extend down over the end of bottom electrode 32D away from the end on which contact is made by the wiring portion 48. This provides additional protection against shorting. FIG. 15 is a layout showing the relative sizes and positions of the most important masks used in fabricating the integrated circuit of FIG. 15. Dotted line 74D outlines the area of the memory cell 71 and dotted line 75D defines the area of transistor 22. Mask 76D defines the word line 28, mask 77D defines the wells 44B and 45 (FIG. 9), mask 78D defines the bit line 59, mask 80D defines the well 46 (FIG. 10), mask 81D defines the bottom electrode 32D, mask 82D defines the active layer 34D, mask 83D defines the top electrode 36D, mask 84D defines the well 53B, and mask 85D defines plate line 55B. Mask 87 defined the wiring connection 48 between the active area 24 and the bottom electrode 32D.

Figure 55:
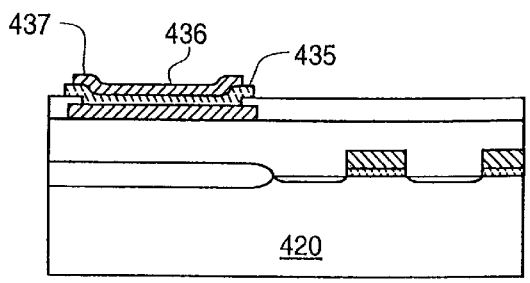
Figure 56:
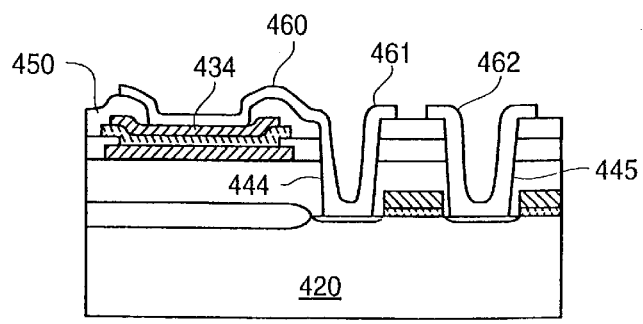
Figure 57:
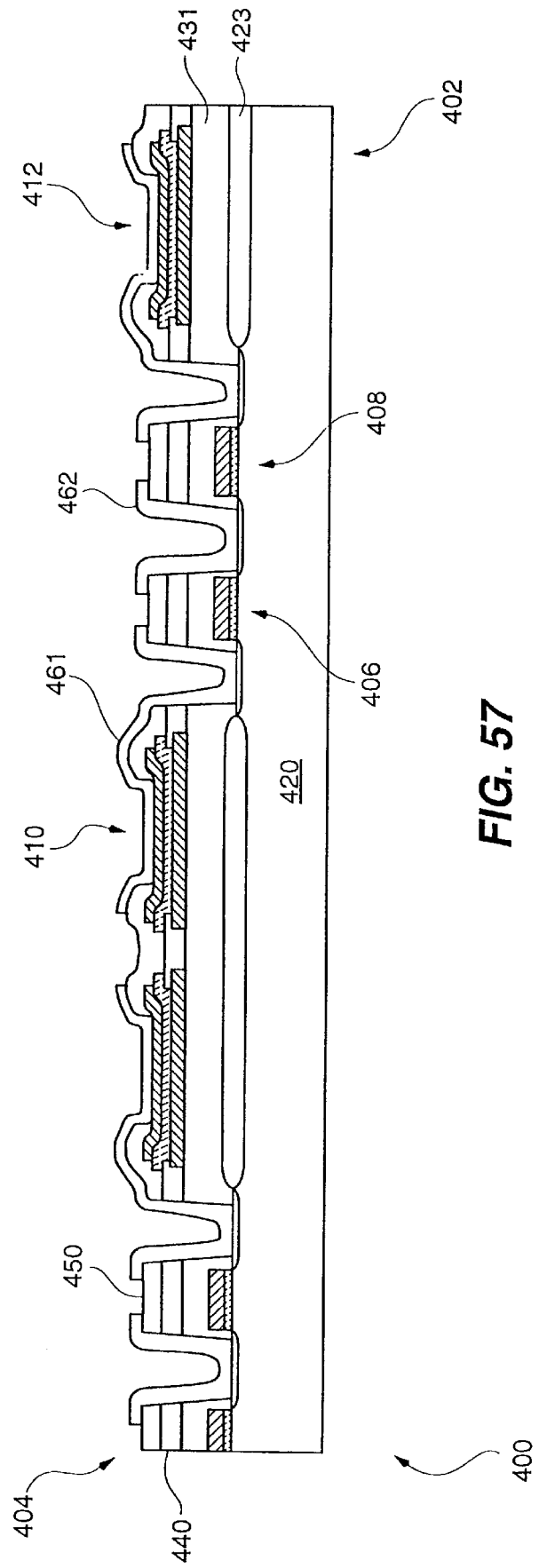
FIG. 57 is a cross-sectional view of the 2T-TC memory cell fabricated according to the method of FIGS. 53–56.

FIGS. 53 through 57 illustrate another embodiment of an integrated circuit 400 according to the invention and the process of making the integrated circuit FIG. 57 shows one memory cell 402 of the integrated circuit 400 and a portion 404 of an adjoining cell to illustrate the design of the memory. The memory cell 402 includes two transistors, 406 and 408, and two capacitors, 410 and 412, and thus is termed a 2T-2C memory. Only the portion of the memory cell 402 including transistor 406 and capacitor 410 is shown in FIGS. 53–56, since this is sufficient to illustrate the fabrication process; that is transistor 408, and the other memory cell transistors in the memory, are made in the same process steps as transistor 406 while capacitor 412, and other memory cell capacitors in the memory are made with the same process steps as capacitor 410. FIGS. 53 through 56 are cross-sectional views of a wafer 401 on which integrated circuit memory cell 402 is formed, showing progressive stages in one of the preferred fabrication methods according to the invention. The memory cell 402 is fabricated on an underlying substrate 420 that may be silicon, gallium arsenide, glass, ruby or other conventional substrate material known in the art. Preferably, it is n-type silicon. A field oxide layer 423 is grown on the silicon substrate 420, and transistor 406 is fabricated by depositing a thin gate oxide 427, preferably silicon dioxide, and a gate electrode (word line) 428. As known in the art, gate 428 may comprise several layers of different materials. Preferably it includes a polysilicon layer adjacent the oxide 427. Doped active areas 424 and 425, preferably a p-type dopant, are formed in a conventional manner. A very thin contact layer 29 of titanium silicide ($TiSi_2$) may be deposited and patterned as discussed in reference to FIGS. 2–4, but this layer eventually diffuses into the wiring layer and substrate, so it is not shown for simplicity. An interlayer dielectric 431 is then deposited, which is preferably spin-on-glass (SOG) or other insulating material, or a multilayered dielectric as discussed in connection with FIG. 3 above. A bottom electrode, i.e. the plate line, preferably a thin, approximately 200 Å thick, adhesion layer of titanium and an approximately 2000 Å thick layer of platinum, is then deposited and patterned on dielectric layer 431, as known in the art. An intracapacitor dielectric 440, preferably silicon dioxide, is then deposited by conventional means. This layer may also be made of silicon nitride or other suitable insulating materials by deposition methods known in the art. The intracapacitor dielectric 440 is optionally planarized by a CMP process, and then patterned, preferably by a self-patterning process described below, or by a conventional mask and etch process, to form opening 441 above bottom electrode 432. The mask is such as to not completely expose electrode 432, but leaves an edge 443 overlapping the electrode on all sides.

Figure 54:
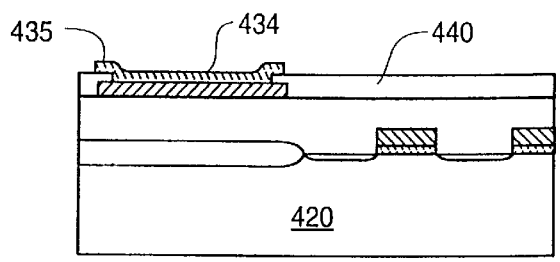

Turning to FIG. 54, ferroelectric/dielectric layer 434 is then deposited and patterned preferably by a process described below. The patterning mask is preferably sized so that the end 435 of layer 434 overlaps intracapacitor insulator 440 on all sides. Thus, intracapacitor insulator 440 extends between electrode 432 and ferroelectric/dielectric layer 434. As shown in FIG. 55, top electrode 436 is then deposited and patterned. This electrode 436 is preferably a layer of platinum of about 2000 Å in thickness and is deposited by sputtering and patterned by a conventional photomask and etch process. The mask used has a smaller mask opening than the mask used for the patterning of layer 434, so that edge 435 of ferroelectric/dielectric 434 extends beyond the ends of top electrode 436 on all sides. The capacitor structure just described, including an intracapacitor insulator 440 and the ferroelectric/dielectric edge 435 that extends beyond the edges 443 and 437 of the intracapacitor insulator and top electrode 436, prevents shorting of the capacitor.

Another interlayer dielectric 450 is then deposited as shown in FIG. 56. Preferably, layer 450, like layer 431 is also preferably SOG, but may be any other suitable dielectric material. This is followed by the formation of wells 444 and 445, again by a photomask/etch or other conventional process. Metalization layer 460 is then deposited and patterned, again in a conventional manner, to form the bit line 462 and the connection 461 between transistor 406 and the capacitor 410 to the active area 25. As known in the art, metalization layer 460 may be made of a single layer of a material such as aluminum or titanium, or may be multiple layered as described in the patent referenced above. The integrated circuit 400 is then completed by formation of a passivation layer, such as a TEOS layer formed by chemical vapor deposition (CVD), and other conventional layers and processes known in the art.

As indicated above, the embodiments of FIGS. 8–15 and 53–57 are presented to illustrate some alternative structures and processes to the preferred structure and processes of FIGS. 1–7, so that it is clear that the protective layer materials, the self-patterning materials, the various capacitor structures and processes described below, and the processes associated with making these materials and structures can be used with integrated circuit embodiments other than the preferred integrated circuit embodiments of the invention shown in FIGS. 1–7. These protective layer materials, self-patterning materials, capacitor structures and processes, and the processes associated with making these materials and structures can also be used with many other integrated circuit embodiments also.

2. Details of the Fabrication Processes

The remainder of the specification describes in detail various processes that may be used to fabricate integrated circuit capacitors, such as 30, 30A, 30B, 30D, and 410 utilizing a self-patterned material, and describes processes for fabricating protective layers, such as 40, 40A, and 40B, utilizing the novel materials and utilizing self-patterned materials to form these and certain of the silicon oxide layers, such as 340, which require fine patterning. In illustrating the processes, it also describes additional structures for integrated circuit capacitors related to these processes. It should be understood that any of the processes and structures below can be used with any of the integrated circuits described above, and vice-versa. Every possible combination is not specifically included herein, since this would unduly lengthen the disclosure. In some cases modifications of the integrated circuit, the process, and/or the capacitor will have to be made to make the combination. For example, in the capacitor process examples given below, the protective layer is not shown or described, since an important aspect of the process is that the active layers are protected by the process, from at least some destructive aspects of conventional integrated circuit processing, even without a protective/sacrificial layer, thus, to combine any of the capacitor processes with any of the above integrated circuits, it is clear that the protective layer structure and process will have to be included. Likewise, in any combination requiring a modification, the required modifications will be clear to the reader and clear to those skilled in the art.

2A. The Fabrication of the Integrated Circuit Capacitor

Figure 16:
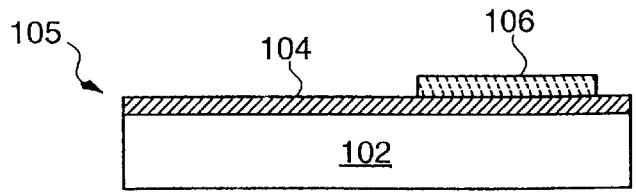
FIGS. 16–21 illustrate various stages in a lift-off method according to the invention of making a capacitor, which method may be utilized in making the integrated circuit capacitors of FIGS. 5, 11 and 14.
Figure 19:
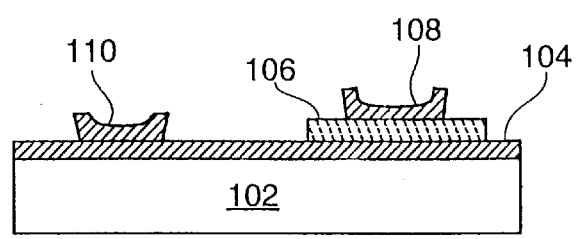
Figure 20:
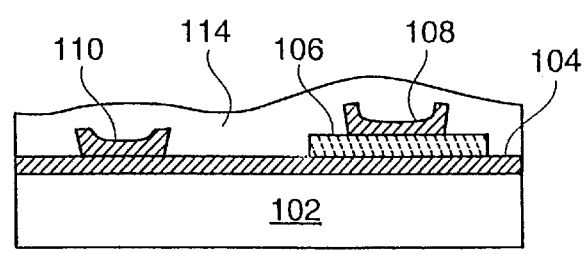
Figure 21:
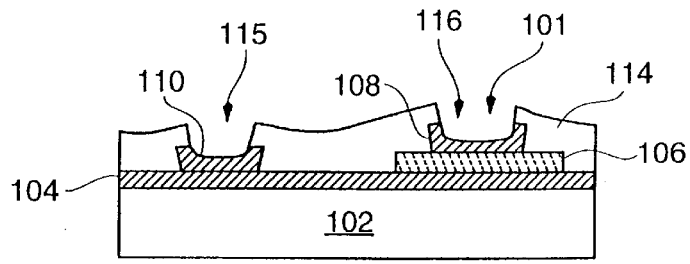

Turning to FIGS. 16–22, a lift-off process for forming a capacitor 101 (FIG. 21) on an insulating layer 102 is illustrated. Layer 102 may be considered to be a layer such as 31 in FIGS. 8–14. The process can also be used to fabricate a capacitor on a poly or tungsten plug, such as shown with the integrated circuits of FIGS. 5 with appropriate modification of the layer 102. In conventional integrated circuit fabrication, patterning using an etching process is usually preferred to a lift-off process. However, as will be shown in more detail below, the lift-off process is preferred for use with self-patterned materials, particularly layered superlattice materials, because it protects the material from a direct etch. Referring to FIG. 21, the capacitor 101 includes a bottom electrode 104, a dielectric or ferroelectric material 106, and top electrode 108. A portion 110 of the metalization that connects the bottom electrode 104 to the rest of the integrated circuit, such as the metalization 48 in integrated circuit 64 (FIG. 11), is also formed in this process, though this is optional. Referring to FIG. 16, bottom electrode 104 has been formed on insulator 102 to form a substrate 105 on which active layer 106 comprising a self-patterned material has been deposited and patterned. Insulator 102 is preferably a form of silicon dioxide, although it may also be another insulator or a wafer of silicon or gallium oxide or other integrated circuit substrate material. Bottom electrode 104 is preferably a layer of platinum about 2000 angstroms (Å) thickness, and is deposited by sputtering, but also may include an adhesion layer of titanium of about 200 Å thick, or may be any other suitable conducting material or multiple layers of conducting materials. Bottom electrode 104 has been patterned, preferably by a conventional ion milling process, and the figure has been terminated beyond the patterning of the bottom electrode since the rest of the circuit is shown in FIGS. 8–14 and is not of immediate concern.

Figure 52:
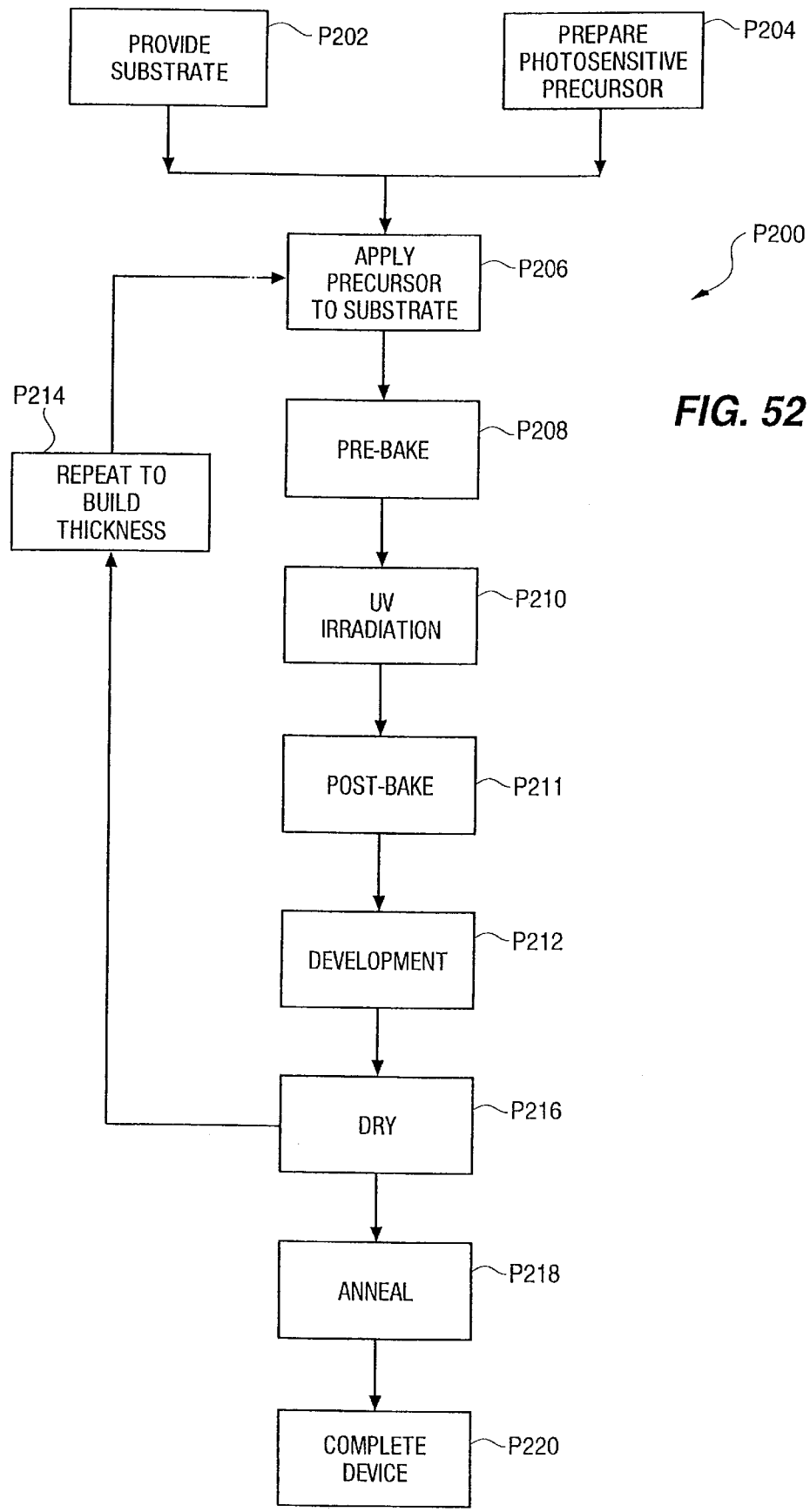
FIG. 52 is a flow chart showing the steps of the preferred process of making a self-patterned material according to the invention.
Figure 53:
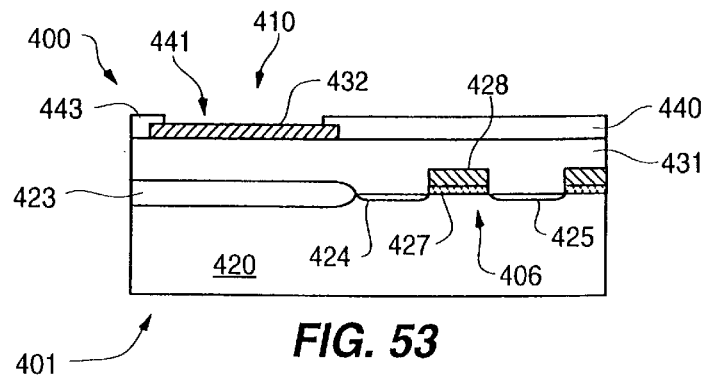
FIGS. 53–56 are cross-sectional views of the preferred embodiment of an integrated circuit 2T-TC memory cell according to the invention illustrating progressive stages in the preferred fabrication method of this embodiment according to the invention.

Active layer 106 is preferably a thin film of strontium bismuth tantalate or other layered superlattice material. It also may be some other metal oxide, such as PZT. It is deposited as shown in FIG. 52. Step P202 includes providing substrate 105. As indicated above, substrate 105 may be an insulating layer such as 31 in FIG. 11, or any type of underlying integrated circuit substrate or optical substrate, together with any layers, such as 104, deposited on the substrate prior to the deposition of subsequent layers. Step P204 includes preparing a photosensitive liquid solution. The photosensitive liquid solution contains at least one photo-reactive compound. The photosensitive solution may be: 1) an alkene monomer or plurality of alkene monomers each having a metal bonded to a free radical polymerizing agent and a free radical photo initiator dissolved in an organic solvent such as described in U.S. patent application Ser. No. 08/653,444 filed May 24, 1996; 2) a metal-alkoxide, metal acetylacetonate, and/or a metal carboxylate, a nitro compound, and a stabilizer as described in U.S. patent application Ser. No. 08/570,576 filed Dec. 11, 1995; 3) an o-nitrobenzyl alcohol in a sol-gel solution as described in Soyama et al., *The Formation of a Fine-Patterned Ferro-* electric Thin-Film From a Sol-Gel Solution Containing a Photo-Sensitive Water Generator, Proceedings Of The International Symposium On Applied Ferroelectrics (1994); 4) an unsubstituted metal alkoxide with a stabilizing additive, such as described in U.S. patent application Ser. No. 08/570,576 filed Dec. 11, 1995. In each case the photosensitive solution contains a plurality of elements in appropriate amounts for forming a desired compound with a desired stoichiometry upon applying the solution to a substrate to form a thin film, exposure of the thin film to radiation, development of the thin film, and treating the film to form a solid material. The elements preferably include metals. Metals that are useful include transition metals, especially, scandium, titanium, vanadium, chromium, manganese, iron, cobalt, nickel, copper, yttrium, zirconium, niobium, molybdenum, technetium, ruthenium, rhodium, palladium, silver, lanthanum, hafnium, tantalum, tungsten, rhenium, osmium, iridium, platinum, gold, and actinium; the lanthanide series metals, especially, cerium, praseodymium, neodymium, promethium, samarium, europium, gadolinium, terbium, dysprosium, holmium, erbium, thulium, ytterbium, and lutetium; the rare earth metals including calcium, strontium, barium, and radium; and the alkali metals including lithium, sodium, potassium, rubidium, cesium, and francium. Other metals for use in the present invention include magnesium, zinc, cadmium, aluminum, gallium, indium, thallium, germanium, lead, tin, antimony, and bismuth. Nonmetallic elements that are useful in materials incorporated into integrated circuits by the process of the invention include selenium, tellurium, phosphorous, silicon, and boron.

In the case of layered superlattice materials, the photosensitive solution is preferably either: 1) an alkene monomer or plurality of alkene monomers each having a metal bonded to a free radical polymerizing agent and a free radical photo initiator dissolved in an organic solvent such as described in U.S. patent application Ser. No. 08/653,444 filed May 24, 1996; or 2) a metal-alkoxide, metal acetylacetonate, and/or a metal carboxylate, a nitrocompound, and a stabilizer as described in U.S. patent application Ser. No. 08/570,576 filed Dec. 11, 1995.

Four examples of the preparation of a photosensitive solution for use in making a layered superlattice material are given below. These solutions are preferably used in forming the ferroelectric layer of a ferroelectric capacitor, such as layers 34, 34A–34D, 106, 126, 156, 176, 256, 286, 334, and 434, but may also be used in forming the protective sacrificial layers 40, and 40A–40C.

EXAMPLE 1

The ingredients in Table 1 were purchased from the sources indicated, and measured in the amounts shown. In the tables, "FW" indicates formula weight, "g" indicates grams, "mmoles" indicates millimoles, and "Equiv." indicates the equivalent number of moles in solution. The tantalum pentabutoxide, strontium diisopropoxide, and 25 ml methyacrylic acid were mixed with 20 ml of 2-methoxyethanol solvent in a 300 ml Erlenmeyer flask fitted with a distillation head. The reaction mixture was heated to 120° C. for twenty four hours with constant magnetic stirring to make a homogenous solution. The large excess amount of methacryllic acid and the long reaction time with distillation to eliminate water and alcohol (isopropyl and butyl) byproducts drove the reaction substantially to completion. The reaction product included tantalum and strontium alkoxy acrylates, and was concentrated by vacuum evaporation at 120° C. at 10–30 mm Hg for one hour to remove about 15 ml of solution. The concentrated presolution stood until it reached room temperature.

The bismuth triethoxide was dissolved in 20 ml of 2-methoxyethanol at room temperature in a 300 ml Erlenmeyer flask fitted with a distillation head. An 8.7 ml quantity of methacrylic acid was added, and the mixture was reacted at 60–80° C. for twenty-four hours with constant magnetic stirring. The reaction product contained a bismuth alkoxy acrylate, and was concentrated by vacuum evaporation at 60–80° C. at 10–30 mm Hg for one hour to remove about 15 ml of a solution. The concentrated presolution stood until it reached room temperature.

TABLE 1

| Ingredient | FW (g/mol) | Grams | mmole | Vendor |
| --- | --- | --- | --- | --- |
| strontium diisopropoxide | 205.80 | 2.09 | 10.16 | Strem |
| bismuth triethoxide | 344.16 | 9.33 | 27.11 | Vnipim |
| tantalum pentabutoxide | 546.52 | 12.35 | 22.60 | Vnipim |
| 1-hydroxy-cyclohexylphenylketone | 204.3 | 2.308 | 11.30 | Aldrich |
| methacryllic acid | 86.09 | 23.5 (25 ml) | 273.0 | Aldrich |
| methacryllic acid | 86.09 | 8.14 (8.7 ml) | 94.5 | Aldrich |

A photosensitive solution was prepared at room temperature by mixing the strontium and tantalum alkoxy acrylate pre solution with the bismuth alkoxy acrylate pre solution. The solution metals were present in proportions capable of yielding a metal oxide having the empirical formula $Sr0.853Bi_{2.277}Ta_{1.893}O_9$. The preformulation includes an approximate 14% excess bismuth amount and an approximate 2% excess tantalum amount as compared to the Smolenskii formula (I) below. These excess percentages account for anticipated metal volatilization losses in the anneal. Thus, the solution was designed to yield a strontium bismuth tantalate metal oxide corresponding to the Smolenskii formula (I). The 1-hydroxy-cyclohexylphenylketone was added to the solution at room temperature, and 2-methoxyethanol was added to adjust the molarity of the solution to 0.12 mol per liter.

EXAMPLE 2

The ingredients shown in Table 2 were purchased from the sources indicated, and measured in the amounts shown.

TABLE 2

| Ingredient | FW (g/mol) | Grams | mmole | Vendor |
| --- | --- | --- | --- | --- |
| strontium | 87.62 | 1.39 | 15.86 | Aldrich |
| bismuth triethoxide | 344.16 | 12.01 | 34.89 | Vnipim |
| tantalum n-butoxide | 546.56 | 17.34 | 31.72 | Vnipim |
| 2-nitrobenzaldehyde | 151.12 | 2.40 | 15.86 | Aldrich |
| 1,3-butanediol | 90.12 | 5.72 | 63.44 | Aldrich |

The strontium and tantalum n-butoxide were mixed with 90 grams of 2-methoxyethanol solvent in a 300ml Erlenmeyer flask fitted with a distillation head. The mixture was heated to 100° C. for 30 minutes with constant magnetic stirring to make a homogeneous solution. After cooling down to room temperature, the bismuth triethoxide was dissolved in the solution. Then, a photosensitive solution was made by adding the 2-nitrobenzaldehyde and 1,3-butanediol to the solution and reacting. Finally, the solution was diluted with 2-methoxyethanol to adjust the concentration of the metal oxide component in the solution to 0.12 mol per liter. The stoichiometry of the metal oxide formed from this solution was $SrBi_{2.2}Ta_2O_{9.3}$.

EXAMPLE 3

The ingredients shown in Table 3 were purchased from the sources indicated, and measured in the amounts shown.

The tantalum pentabutoxide, niobium pentabutoxide, strontium methoxypropoxide, and 25 ml 2ethyl-2-hexenoic acid were mixed with 20 ml of 2-methoxyethanol solvent in a 300 ml Erlenmeyer flask fitted with a distillation head. The reaction mixture was heated to 120° C. for twenty-four hours with constant magnetic stirring to make a homogenous solution. The large excess amount of 2-ethyl-2-hexenoic acid and the long reaction time with distillation to eliminate water and alcohol byproducts drove the reaction substantially to completion. The reaction product included tantalum, niobium, and strontium alkoxy acrylates, and was concentrated by vacuum evaporation at 120° C. and 10–30 mm Hg for 1.5 hours to remove about 15 ml of solution. The concentrated presolution stood until it reached room temperature.

TABLE 3

| Ingredient | FW (g/mol) | Grams | mmole | Vendor |
| --- | --- | --- | --- | --- |
| strontium ethoxypropoxide | 205.80 | 3.03 | 10.17 | Strem |
| bismuth tri-t-pentoxide | 470.39 | 12.76 | 27.12 | Gelest |
| tantalum pentabutoxide | 546.52 | 7.41 | 13.56 | Vnipim |
| niobium pentabutoxide | 458.12 | 4.14 | 9.04 | Vinipim |
| 2,2 dimethoxy-2-phenylacetophenone | 256.3 | 2.90 | 11.30 | Aldrich |
| 2-ethyl-2-hexenoic acid | 142.20 | (33.25 ml) | 233.8 | Aldrich |
| 2-ethyl-2-hexenoic acid | 142.20 | (33.25 ml) | 80.2 | Aldrich |

The bismuth tri-t-pentoxide was dissolved in 20 ml of 2-methoxyethanol at room temperature in a 300 ml Erlenmeyer flask fitted with a distillation head. A 25 ml quantity of 2-ethyl-2-hexenoic acid was added, and the mixture was reacted at 60–80° C. for twenty-four hours with constant magnetic stirring. The reaction product contained a bismuth alkoxy acrylate, and was concentrated by vacuum evaporation at 60–80° C. and 10–30 mm Hg for 1.5 hours to remove about 15 ml of solution. The concentrated presolution stood until it reached room temperature.

A photosensitive solution was prepared at room temperature by mixing the tantalum, niobium, and strontium alkoxy acrylate presolution with the bismuth alkoxy acrylate presolution. The solution metals were present in proportions capable of yielding a metal oxide having the empirical formula $Sr_{0.853}Bi_{2.274}Ta_{1.137}Nb_{0.758}O_9$. The preformulation includes an approximate 14% excess bismuth amount and an approximate 2% excess B-site metal amount as compared to Formula (3) above. The B-site metals are split between tantalum (60%) and niobium (40%). These excess percentages account for anticipated metal volatilization losses in the anneal. Thus, the solution was designed to yield a strontium bismuth niobium tantalate metal oxide corresponding to the Smolenskii formula (1) below. The 2,2 dimethoxy-2-phenylacetophenone was added to the solution at room temperature, and n-octane was added to adjust the molarity of the solution to 0.12 mol per liter.

EXAMPLE 4

In this example, a 0.14 Mole (M) metal-alkoxycarboxylate photo precursor solution designed to yield a layered superlattice material, namely strontium bismuth tantalum niobate having the formula $Sr_{0.75}Bi_{2.3}(Nb_{0.45}Ta_{1.55})O_{9.1}$ was made. The materials indicated in Table 5 were measured. In this table "Equiv." indicates the equivalent number of moles in solution.

TABLE 4

| Ingredient | FW (g/mol) | Grams | mmole | Equiv. |
| --- | --- | --- | --- | --- |
| Tantalum (V) ethoxide | 406.25 | 12.59 | 31.0 | 1.55 |
| Niobium (V) ethoxide | 318.21 | 2.86 | 9.0 | 0.45 |
| 1-methoxy-2-propanol | 90.12 | 40 ml | 408 | — |
| 2-ethylhexanoic acid | 144.21 | 30.0 | 208.0 | — |
| Strontium | 87.62 | 1.314 | 15.0 | 0.75 |
| Bismuth 2-ethylhexanoate (in 22% 1-methoxy-2-propanol) | 949.77 | 42.36 | 44.6 | 2.23 |

An Erlenmeyer flask equipped with a reflux condenser was used to combine the strontium (1.314g) for reaction with a large excess amount (40 ml) of 1-methoxy-2-propanol to form a reaction mixture. Tantalum (V) ethoxide (12.59 g) and niobium (V) ethoxide (2.86 g) were combined with the reaction mixture. The reaction mixture was refluxed with magnetic stirring at 120° C. for three hours to dissolve and react the strontium metal with the 1-methoxy-2-propanol. The 2-ethylhexanoic acid (30.0 g) was added to the hot reaction mixture, which was again refluxed at 130° C. for additional three hours. This second refluxing assisted an exothermic substitution of 2-ethylhexanoate ligands for alkoxide ligands on the respective metals, which produced metal alkoxycarboxylates. The reacted solution was evaporated at a temperature ranging from 50° C. to 120° C. under aspiration vacuum to remove about 20 ml of solvent. The solution stood for cooling to room temperature. The bismuth-2-ethylhexanoate (42.36 g) was added along with sufficient 1-methoxy-2 propanol to adjust the solution yield to 0.14 mmol of $Sr_{0.75}Bi_{2.3}(Nb_{0.45}Ta_{1.55})O_{9.1}$ per Kg. If strong UV radiation is used, this precursor can be used as is for self-patterning processes. Optionally, a small amount, such as about 2.5 grams, of photo sensitizer, such as nitro benzaldehyde may be added and thus less strong UV radiation may be used.

In step P206, the photosensitive liquid solution of step P204 is applied to the substrate 105 of step P202. The preferred form of deposition is spin-on deposition in which a few drops of the photosensitive liquid solution from step P204 are applied to form a thin film of the liquid. The substrate is subsequently spun at about 400 rpm to 3000 rpm for thirty seconds to yield the uniform film. The most preferred rotational velocity for a single spin is 1500 rpm, though, as indicated below, multiple spin rates at other velocities are also preferred. Other liquid deposition techniques, e.g., misted deposition techniques as described in U.S. Pat. No. 5,456,945 issued Oct. 10, 1995 can also be used to deposit the liquid solution. In step P208, the spun-on film is subjected to a pre-bake on a hot plate in air at a temperature ranging from 80° C. to 200° C. for one to three minutes. The most preferred pre-baking conditions are 150° C. for one minute. This pre-baking step stabilizes the film for use in subsequent steps, and is also referred to as a soft-bake because the resultant film is amorphous and contains the above-described compounds in substantially unpolymerized form.

Step P210 includes exposing the dried film from step P208 to ultraviolet radiation. Prior to such exposure, a mask is aligned with substrate 105 using a conventional contact aligner. Deep ultraviolet radiation having a wavelength ranging from 250 nm to 300 nm is preferred, as is a total energy delivery of at least about 500 mili-Joules during the term of exposure. The radiation wavelength and energy delivery may be varied, as required for interaction with a selected photosensitive solution. The ultraviolet radiation initiates a polymerization reaction which gels or hardens the film in the areas exposed to radiation.

Step P211 comprises baking the wafer on a hot plate in air at a temperature ranging from 80° C. to 200° C. for one to three minutes. The most preferred post-baking conditions are 150° C. for one minute. This post-baking step stabilizes the film for use in subsequent steps. In particular, it important in preventing the patterned layer from rinsing off the substrate in the development step. Like the pre-bake step, the post-bake is referred to as a soft-bake because the resultant film is amorphous and contains the above-described compounds in substantially unpolymerized form. Care must be taken when aligning the mask with the substrate 105 each time in step P210, because significant mask alignment error causes misalignment between the newly deposited film and the underlying film. Step P212 includes developing the selectively polymerized film by washing or rinsing the wafer with a developer solution to remove unpolymerized portions of film. A developer solution for each of the four photosensitive solutions described above are disclosed in the respective references. These solutions were generally polar solvents, such as ethanol, water, and acetone. These polar solvents have been found to be too harsh. In the preferred embodiment, apolar solvents, such as alkanes, especially mineral spirits and octane, are utilized in the development step P212.

In steps P216 and P218 the developed film is treated to form a solid film of the desired metal oxide. Treating may include exposure to vacuum or ultraviolet radiation, drying, and heating, including baking and annealing. Preferably treating includes a drying step P216 and an annealing step P218. In the drying step the patterned film on the substrate 105 is typically placed on a hot plate in air and dried at a temperature ranging from 100° to about 300° C. for a time ranging from ten seconds to five minutes. The most preferred drying procedure is a multi-staged drying procedure. For example, the substrate 105 bearing the patterned film is placed on a 140° C. hot plate for one minute followed by 260° C. for four minutes. The final drying step may include a brief exposure to rapid thermal processing apparatus, for example, heating at between 500° C. and 800° C. for from 5 seconds to one minute, and preferably at about 650° C. for thirty seconds under an oxygen flow of 5 cc/minute. In step P214, steps P206–P216 are optionally repeated until the thin film has reached a desired thickness. In step P218, substrate 105 bearing the patterned film is furnace annealed, preferably at a temperature ranging from 600° to 850° C. for from thirty minutes to two hours. The most preferred anneal profile is 750° C. under an oxygen flow for one hour and twenty minutes. Layer 106 is preferably between about 1000 Å and 3000 Å thick, most preferably about 1500 Å thick.

Step P220 includes completing the integrated circuit device. This completing step entails the deposition of additional layers together with the removal or patterning of the additional material, as required. For example, in the preferred embodiment of FIGS. 5 and 7 the layer 106 is a ferroelectric capacitor in an integrated circuit non-volatile memory and the completing step includes adding protective layer 40, an insulating layer 52, the metalization layer 55, and a passivation layer, in other embodiments it may be the dielectric layer of a capacitor in a DRAM memory, the gate of a ferroelectric transistor etc. and the completing step will be the completion of those particular integrated circuits.

In the preferred embodiment the material 106 is a ferroelectric layered superlattice material. Layered superlattice materials are described in detail in U.S. Pat. No. 5,423,285 issued Jun. 13, 1995 and U.S. Pat. No. No. 5,519,234 issued May 21, 1996. In general, a layered superlattice material is defined as a material that can be described by a single chemical formula and which spontaneously forms itself into alternating layers having distinctly different crystalline structure. For example, strontium bismuth tantalate can be considered to be formed of alternating layers of a crystal structure similar to $Bi_2O_3$ and a crystal structure similar to $SrTa_2O_6$, although it must be kept in mind that $SrTa_2O_6$ has a tungsten bronze structure by itself, but within the layered material it has a perovskite structure. Thus the layered structure is in reality a superlattice in which the structures of the individual sublattices of the perovskite layers and the non-perovskite layers are interdependent. These layered materials are natural superlattices, as compared to other superlattices, such as compositional superlattices, which are manufactured or forced superlattices. Thus, the term "layered superlattice material" is selected to distinguish these superlattice materials from alloy type superlattice materials, which are not layered, and superlattice heterostructures, i.e. the compositional superlattices, which are inherently not a "material" but rather layered structures made of at least two different materials having different chemical formulae.

The layered superlattice materials made by the process of the invention are polycrystalline. In the polycrystalline state, the structure of the materials includes grain boundaries, point defects, dislocation loops and other microstructure defects. However, within each grain, the structure is predominately repeatable units containing one or more ferroelectric layers and one or more intermediate non-ferroelectric layers spontaneously linked in an interdependent manner. Thus the layered superlattice materials of the invention which are ferroelectric can be defined as: (A) a material having a localized structure, within a grain or other larger or smaller unit, which localized structure contains predominately repeatable units containing one or more ferroelectric layers and one or more intermediate non-ferroelectric layers spontaneously linked in an interdependent manner. The invention also includes materials that are not ferroelectric, and those that include perovskite-like layers can be included in the following definition: (B) a material having a localized structure, within a grain or other larger or smaller unit, which localized structure contains predominately repeatable units containing one or more perovskite-like layers and one or more intermediate non-perovskite-like layers spontaneously linked in an interdependent manner.

The layered superlattice materials include layered perovskite-like materials catalogued by Smolenskii et al. in *Ferroelectrics and Related Materials,* ISSN 0275-9608, (V.3 of the series Ferroelectrics and Related Phenomena, 1984) edited by G. A. Smolenskii, Sections 15.3 -15.7 and include:

(I) compounds having the formula $A_{m-1}Bi_2M_mO_{3m+3}$, where $A=Bi^{3+}$, $Ba^{2+}$, $Sr^{2+}$, $Ca^{2+}$, $Pb^{2+}$, $K^+$, $Na^+$ and other ions of comparable size, and $M=Ti^{4+}$, $Nb^{5+}$, $Ta^{5+}$, $Mo^{6+}$, $W^{6+}$, $Fe^{3+}$ and other ions that occupy oxygen octahedral; this group includes bismuth titanate, $Bi_4Ti_3O_{12}$;

(II) compounds having the formula $A_{m+1}M_mO_{3m+1}$, including compounds such as strontium titanates $Sr_2TiO_4$, $Sr_3Ti_2O_7$ and $Sr_4Ti_3O_{10}$; and (III) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$. It is noted that in the case of $Sr_2Nb_2O_7$ and $La_2Ti_2O_7$ the formula needs to be doubled to make them agree with the general formula. Layered superlattice materials include all of the above materials plus combinations and solid solutions of these materials.

Layered superlattice materials may be summarized more generally under the formula:

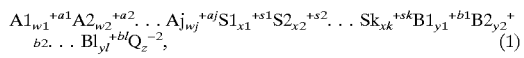
$$A1_{w1}^{+a1}A2_{w2}^{+a2}\ldots Aj_{wj}^{+aj}S1_{x1}^{+s1}S2_{x2}^{+s2}\ldots Sk_{xk}^{+sk}B1_{y1}^{+b1}B2_{y2}^{+b2}\ldots Bl_{yl}^{+bl}Q_z^{-2}, \quad (1)$$

where A1, A2 . . . Aj represent A-site elements in the perovskite-like structure, which may be elements such as strontium, calcium, barium, bismuth, cadmium, lead, and others S1, S2 . . . Sk represent superlattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 . . . wj all equal zero. If there is only one B-site element in the compound, then it is represented by the "B1" element, and y2 . . . y1 all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2W2\ldots+ajwj)+(s1x1+s2x2\ldots+skxk)+(b1y1+b2y2\ldots bjyj)=2z. \quad (2)$$

Formula (1) includes all three of the Smolenskii type compounds: for the type I material, w1=m−1, xi=2, y1=m, z=3m+3 and the other subscripts equal zero; for the type II material, w1=m+1, y1=m, z=3m+1, and the other subscripts equal zero; for the type III material, w1=m, y1=m, z=3m+2, and the other subscripts equal zero. It is noted that the Smolenskii type I formula does not work for M=Ti and m=2, while the formula (1) does work. This is because the Smolenskii formula does not consider valences. The materials according to the invention do not include all materials that can be fit into formula (1), but rather only those materials that spontaneously form layered superlattices. In summary, the materials of the invention include all the materials as described by the definitions (A) and (B) above, the Smolenskii formulas, and the formula (1), plus solid solutions of all the foregoing materials. Terms of art that have been applied to these structures include layered perovskite-like materials, recurrent intergrowth layers, Aurivilius materials, and self-orienting spontaneous intergrowth layers. Even so, no one single term suffices to describe the entire class of layered superlattice materials. Applicants have chosen the term "layered superlattice materials" to describe the entire class of materials because the lattices include a short range order, e.g., a sublayer formed of a perovskite-like oxygen octahedra lattice, and a long range order including a periodic repetition of sublayers, e.g., a perovskite-like sublayer and a superlattice generator metal oxide layer repeated in succession. Further, as in other superlattice materials, the length of the periodicity can be manipulated. For example, as is known in the art of these materials, by adjusting the stoichiometry, the value of "m" in the Smolenskii formulas I, II, and III above can be varied to vary the thickness of the perovskite-like layers. See, *Ferroelectrics and Related Materials,* ISSN 0275-9608, (V.3 of the series Ferroelectrics and Related Phenomena, 1984) edited by G. A Smolenskii, p. 694. The dual order of these periodically repeating structures and the ability to manipulate the periodic distances meets the definition of a superlattice. As indicated above, the term "layered superlattice material" should not be confused with forced heterolattice structures that are made by sputter deposition of successive layers. Layered superlattice materials spontaneously form collated intergrowth layers in an anneal, and do not require the forced deposition of successive layers.

EXAMPLE 5

The following is an example of the production of a UV-patterned film of a layered superlattice material 106. The particular material was strontium bismuth niobium tantalate having the formula $Sr_{0.75}Bi_{2.3}(Nb_{0.45}Ta_{1.55})O_{9.1}$. In this example the precursor solution of Example 4 above was used to produce a thin film capacitor including a dielectric layer 106 of $Sr0.75Bi_{2.3}(Nb0.45Ta_{1.55})O_{9.1}$. About two ml of the 0.14 mol/Kg strontium bismuth niobium tantalate solution of Example 4 was applied to the substrate while the substrate spun at 500 rpm. Revolution speed was increased to 3000 rpm for an additional thirty seconds to provide a film of liquid precursor covering the electrode.

The liquid-coated precursor was soft-baked by placement on a hot plate heated to 150° C. in air for one minute. The soft-baked film was irradiated under a mask by exposure to low pressure mercury-source ultraviolet radiation having a wave-length of about 254 nm. Cumulative irradiation energy was about one Joule to promote decomposition of the ligand in the film. Post-bake in air on hot plate heated to 150° C. established a pattern in the solution film.

The pattern was developed by placing the ultraviolet-exposed substrate in an agitation bath containing mineral spirits. The bath was agitated with mild motion for thirty seconds to develop the exposed negative patterns. The developed substrate was placed in a rinse bath containing hexane and mildly agitated for five seconds. After rinsing, the substrate was blown with a nitrogen air gun, placed on a hot plate at 240° C. for 5 minutes, and subjected to rapid thermal processing for thirty seconds at 650° C. under an oxygen flow.

The steps of depositing the precursor, soft-baking, irradiating, developing, rinsing, and drying were repeated one time to increase the patterned film thickness.

The dried, patterned film was annealed in an oxygen diffusion furnace at 750° C. for one hour and twenty minutes including ten minutes each for the ramp into the furnace and the ramp out of the furnace. The device was completed as discussed below by sputtering a platinum top electrode and patterning the top electrode using a conventional reactive ion etching procedure to form a plurality of integrated circuit capacitor devices on the wafer.

Figure 17:
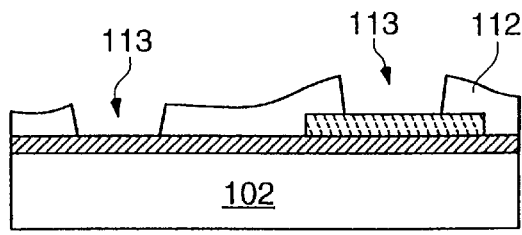
Figure 18:
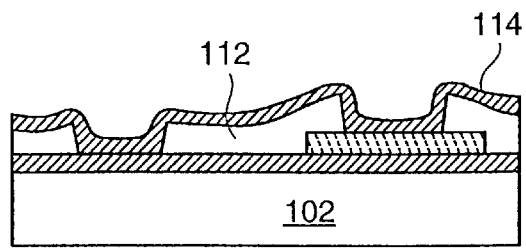

Returning now to the fabrication process of FIGS. 16–21, in FIG. 17 a resist layer 112 has been deposited and patterned by conventional mask, photo, develop, and etch processes known in the art. It should be noted that the solvent used to develop the resist is typically xylenes, n-butyl acetate, methanol, or other such organic liquids. These liquids are much less damaging to any metal oxide, particularly the layered superlattice materials, such as $SrBi_2Ta_2O_9$, than the acids used in etches. Then, in FIG. 18 another electrode layer 114 is deposited. Layer 114 is preferably about 2000 Å of sputtered platinum, but may also be other suitable conductors, or multiple layers of various conductors, such as titanium and platinum. Optionally, a conventional ion milling step may follow to pattern top electrode 108 and metalization portion 110. Resist layer 112 is then stripped by conventional methods known in the art, taking the platinum above it with it, to leave top electrode 108 and metalization portion 110 as shown in FIG. 19. Again, the stripping agents are solvents, such as xylenes, n-butyl acetate, and methanol, which are relatively benign to the layer 106. Then, as indicated in FIG. 20, a layer 114 of an interlayer dielectric (ILD), which may be any suitable insulator but is preferably SOG, is deposited. As shown in FIG. 21, $SiO_2$ holes 115 and 116 are then opened to the top electrode 108 and metalization 110 by a conventional photo resist, mask, and etch process. The integrated circuit is then completed by steps discussed in the references given above. A review of the process just described shows that the capacitor 101 has been fabricated without exposing the material 106 to an etch. As is known in the art, the rest of the IC fabrication process (after the protective layer 40 if a protective layer is used) usually begins with the deposition of an interlayer dielectric (ILD) 114, or, in terms of FIG. 5, such as 52, which together with the platinum 108, 110, protects the material 106 from any subsequent processing. Thus, in the entire fabrication process, the only direct exposure of the material 106 is to the relatively benign resist solvents. The process just described can be used in combination with any of the processes below to fabricate an integrated circuit.

Figure 22:
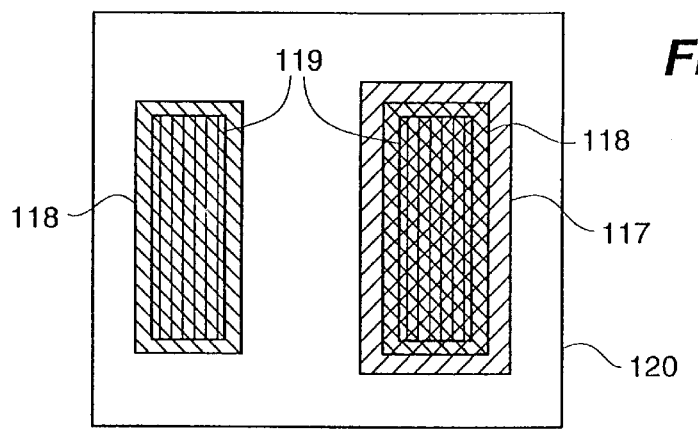
FIG. 22 is a layout of the masks used in fabrication of the capacitor of FIG. 21.

FIG. 22 is an overlay as known in the art showing the mask dimensions of the various masks used in the method of FIGS. 16–21 superimposed on substrate 105. The boundary 117 is the shape of the mask used in the self-patterning step P210 (FIG. 52), the boundary 118 is the mask used to open the holes 113 in resist 112 which define the top electrode 108 and metalization portion 110, the boundary 119 is the mask used to open the holes in the ILD 114, and the outer boundary 120 is the mask used to define the bottom electrode 104.

Figure 23:
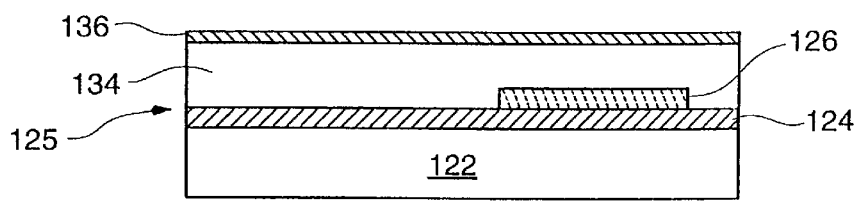
FIGS. 23–29 illustrate various stages in an alternative lift-off method according to the invention of making a capacitor, which method may be utilized in making the integrated circuit capacitors of FIGS. 5, 11 and 14.
Figure 24:
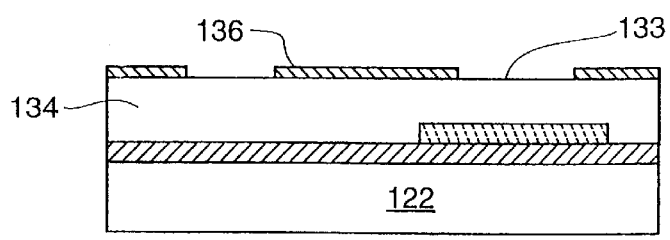
Figure 25:
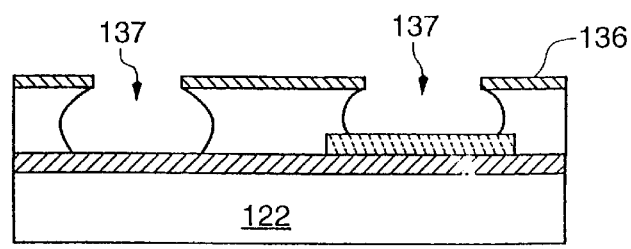
Figure 26:
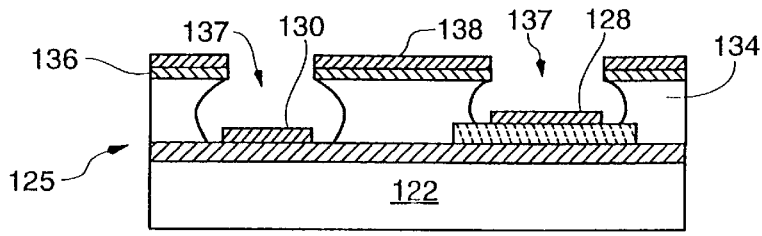
Figure 27:
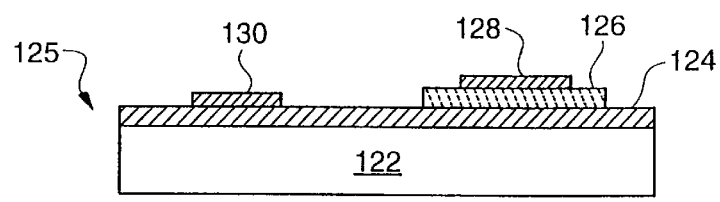
Figure 28:
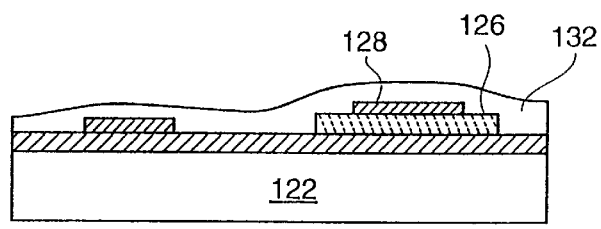
Figure 29:
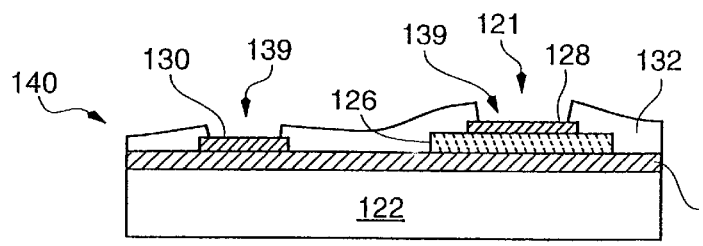
Figure 30:
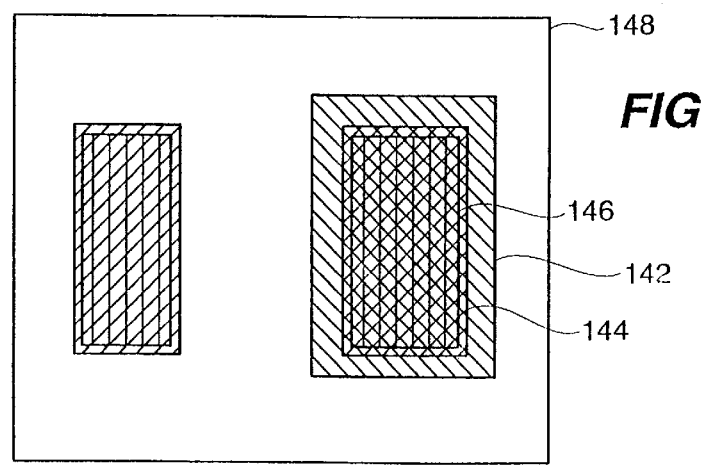
FIG. 30 is a layout of the masks used in the fabrication of the capacitor of FIG. 29.

Turning now to FIGS. 23 through 29 another lift-off process is shown according to the invention. Again, this process can be used in combination with any of the structures and/or processes discussed above and any of the other structures and/or processes discussed below to fabricate an integrated circuit. And again, it results in the active material 108 being exposed only to relatively benign processing during the entire IC fabrication process. Referring to FIG. 29, this process results in a capacitor 121 comprising bottom electrode 124, ferroelectric/dielectric layer 126, and top electrode 128, plus metalization portion 130 with an interlayer dielectric 132 deposited before completing the rest of the integrated circuit. In FIG. 23 a bottom electrode 124 and a self-patterned ferroelectric/dielectric layer 126 have been deposited and patterned on an insulating layer 122 to form a substrate 125 as discussed above with respect to FIG. 16. In addition a resist layer 134 has been deposited plus an expendable layer 136 that typically will be aluminum, but may also be silicon dioxide, silicon nitride and other materials that may be used to provide a mask resistant to the solvent or solvents that dissolve resist 134. Then, in FIG. 24, the layer 136 has been patterned in a conventional process of depositing another resist layer, followed by mask, photo, develop, and etch steps followed by a resist strip to open mask holes 133. Then, in FIG. 25 an isotropic resist etch has been performed to open holes 137. Again, this etch is done with solvents, such as xylenes, n-butyl acetate, and methanol, that are relatively benign to the material 134. As indicated in FIGS. 25 and 26, this etch tends to expand the holes 137 beyond the edges of the aluminum mask 136, which is beneficial in obtaining a top electrode that spans the full width and more of the mask holes 133. In FIG. 26 a layer 138 of platinum or titanium/platinum has been deposited which forms electrode 128 and metalization portion 130 in the holes 137. Then, in FIG. 27, the resist layer 134 has been stripped, which also strips away the layers 136 and 138 on top of it, again with the solvents that are relatively benign to layer 126. In FIG. 28, an interlayer dielectric (ILD) insulating layer 132 has been deposited, which preferably is spin-on-glass (SOG) but may also be some other form of silicon dioxide, silicon nitride, or other suitable insulator. Then, in FIG. 29 a further resist deposition, mask, photo, develop, etch and strip process has been performed to form holes 139 in ILD 132, leaving the circuit portion 140 ready for metalization and capping. In these steps, the platinum 128 protects the active material 126 from damage. FIG. 30 is an overlay showing the mask dimensions 142, 144, and 146 that were used to form the self-patterned ferroelectric/dielectric layer 126, the mask used to form the holes 133 in the aluminum mask 133 which eventually defines the top electrode 128 and metalization portion 130, and the mask used to define the $SiO_2$ holes 139. Again, outer boundary 148 represents the mask used to form bottom electrode 124. In summary, prior to the fabrication stage shown in FIG. 28, the active material 126 is not exposed to any harsh processing steps, such as acid etches. Beginning with and subsequent to the stage shown in FIG. 28, the active material 126 is protected from contact with any IC processing materials by platinum electrode 126 and ILD 132. Thus, the process of FIGS. 23–30 is designed to protect the active layer 126 from harsh conventional IC processing through the entire IC fabrication process.

Figure 31:
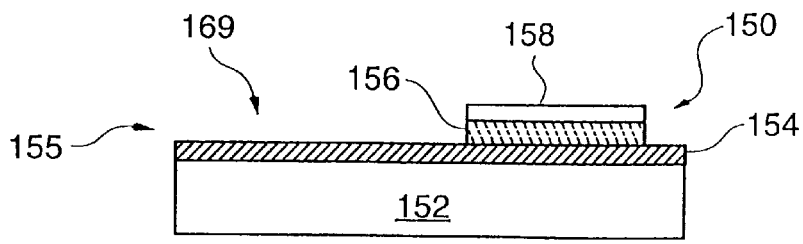
FIGS. 31–35 illustrate various stages in a method according to the invention of making a capacitor utilizing a SOG wet etching step, which method may be utilized in making the integrated circuit capacitors of FIGS. 5, 11 and 14.

Turning now to FIGS. 31 through 35, an alternative process that includes an SOG wet-etching step contacting the self-patterned layers 150 is illustrated. This process can be used in combination with any of the processes discussed above or below to fabricate an integrated circuit. In FIG. 31 a bottom electrode and a self-patterned material 150 have been formed and patterned on insulator 152 to form a substrate 155 by a process as discussed above in relation to FIG. 21, except that in the steps P206 through P216, two different layers 156 and 158 of self-patterning material 150 have been deposited. The first layer 156 is formed of the desired ferroelectric/dielectric material, and the second layer 158 is formed of a material that is reduced by the $SiO_2$ etchant to yield the desired material. For example, this process preferably comprises applying, pre-baking, UV irradiating, developing, then drying and baking one or more layers of strontium bismuth tantalate in steps P206–P216. The drying and baking is preferably on a hot plate at between 100 and 300° C. for between 30 seconds and five minutes, preferably in a two step drying process as described above with respect to step P216. The strontium bismuth tantalate is then annealed as described above with respect to step P218, preferably at a temperature ranging from 600° to 850° C. for from thirty minutes to two hours. As indicated above, the most preferred anneal profile is 800° C. under an oxygen flow for one hour. Then a protective layer of bismuth-excess strontium bismuth tantalate or bismuth oxide ($Bi_2O_3$) is deposited, patterned, developed, dried, and annealed also according to the process of steps P206–P218 of FIG. 52, with the same preferred drying and annealing profiles. The photosensitive solution for the bismuth oxide is prepared from the bismuth triethoxide solution as described above for the bismuth alkoxy acrylate presolution, and then adding the 1-hydroxy-cyclohexylphenylketone and 2-methoxyethanol, also as described above. Likewise, if an excess bismuth strontium bismuth tantalate protective layer is used, then the photosensitive solution is prepared as described above for strontium bismuth tantalate, except that an appropriate additional amount of the bismuth presolution is used. Alternatively, the strontium bismuth tantalate 156 may be deposited and patterned as described in steps P206–P216, then, in the last repetition of steps P206–P212, depositing, applying, pre-baking, irradiating, and developing the protective layer of bismuth-excess strontium bismuth tantalate or bismuth oxide ($Bi_2O_3$). The two layers 158 and 156 on wafer 169 are then dried and annealed together as described above with respect to steps P216 and P218. Another alternative is that layer 156 is fabricated through drying step P216, then layer 158 is fabricated through drying step P216, and then both layers 156 and 158 are annealed together.

Figure 32:
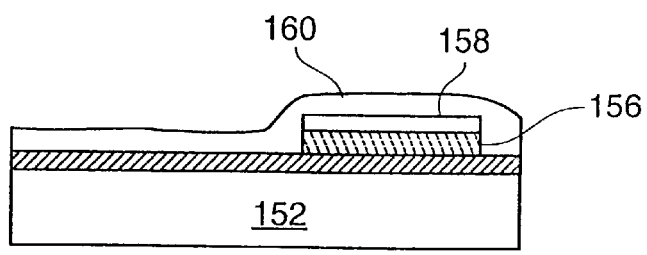
Figure 33:
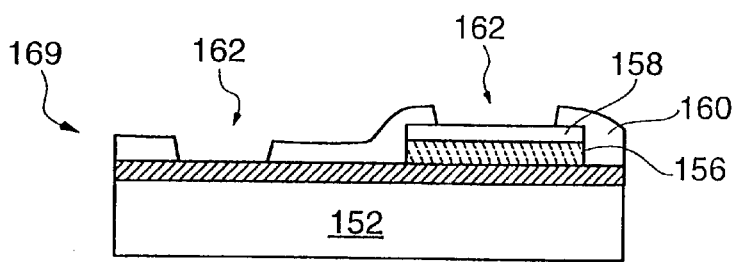
Figure 34:
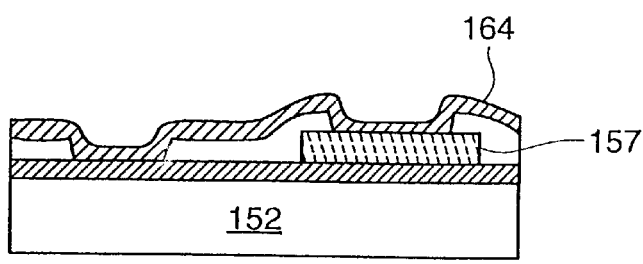
Figure 35:
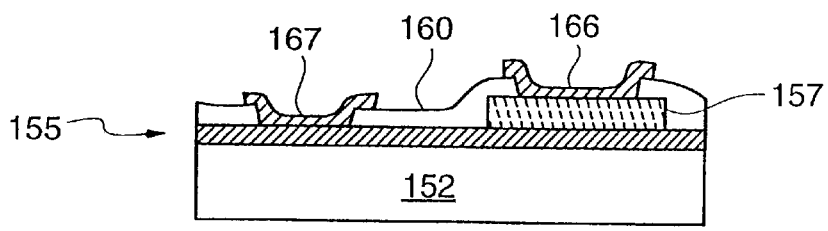

In FIG. 32 a layer 160 of SOG or other form of silicon dioxide has been deposited by a suitable conventional method. Layer 160 could also be other suitable insulators to which etches or other reduction processes are used to pattern. A conventional resist deposition, mask, photo, develop, etch and strip process is then used to produce the result of FIG. 33. As is known in the art, an etchant with high selectivity to $SiO_2$ is used. Preferably a wet etch with HF and $NH_4F$ is used, such as 1 HF (49%)+6 $NH_4F$ (40%). Plasma etches such as $CHF_3$, $CF_4+O_2$, or $CF_4$, $+H_2$ could also be used. In this etch step, protective layer 158 protects the active layer 156 from being damaged by the etchant. In FIG. 33, the layer 158 has been reduced by the etch to a bismuth rich material, which is not crystalline but will contain portions of strontium bismuth tantalate, portions of bismuth oxide, portions of bismuth, and perhaps other bismuth compounds. The wafer 169 is then annealed at between 600° C. and 850° C. for 5 minutes to 90 minutes, and preferably at about 800° C. for one hour. In this anneal any remaining portions of layer 158 are either vaporized as bismuth oxide or are integrated into the crystal structure of the film 156 which crystallizes into a layer 157 of solid strontium bismuth tantalate. If the layer 157 is to be a material other than strontium bismuth tantalate, then the protective layer 158 is selected to be an appropriate material that will protect the layer 156 during the etch, either be reduced by the etch, evaporated by the anneal, and/or integrated into the layer 156 in the anneal, preferably all three. After the anneal, a top electrode layer 164 is deposited. Layer 164 is preferably about 2000 Å of sputtered platinum, but may also be other suitable conductors, or multiple layers of various conductors, such as titanium and platinum. Then follows conventional resist, mask, develop, ion milling, and resist strip steps to pattern top electrode 166 and metalization portion 167. In this process, the mask layout is essentially the same as that shown in FIG. 22. In a variation of the process of FIGS. 31–35, the anneals of the layers 156 and 158 prior to the deposition and patterning of ILD 160 may be skipped, and thus a solid, crystalline, active material 157 is not formed until the final anneal subsequent to the etch of ILD 160. Each of the processes and variations of processes just described with respect to FIGS. 31–35 prevent the conventional etch processes used with silicon oxide ILDs from harming the self-patterning materials.

Figure 36:
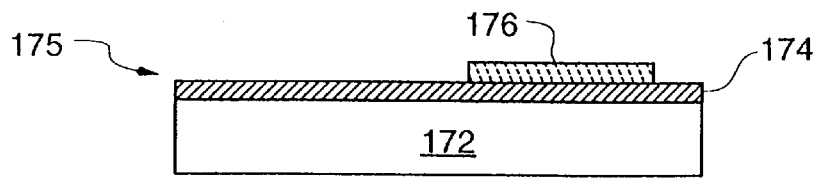
FIGS. 36–40 illustrate various stages in a method according to the invention of making a capacitor utilizing a self-patterning SOG, which method may be utilized in making the integrated circuit capacitors of FIGS. 5, 11 and 14.
Figure 37:
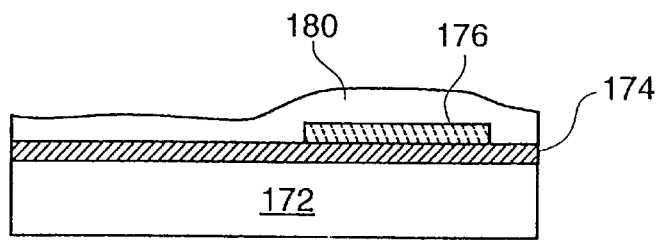
Figure 38:
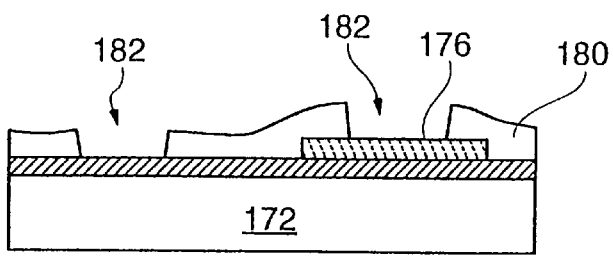
Figure 39:
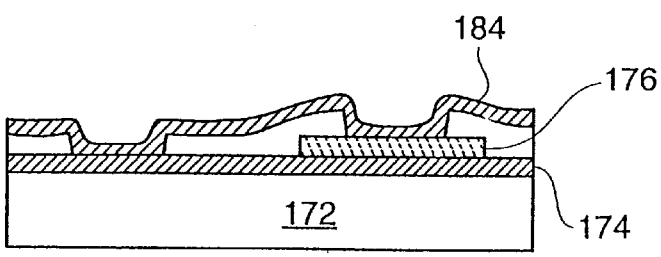
Figure 40:
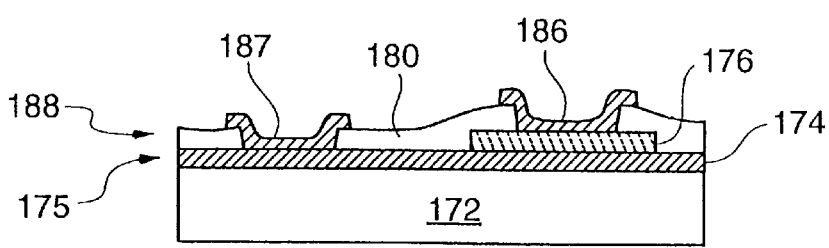

Turning now to FIGS. 36 through 40, there is shown a variation of the process just described, which variation uses a self-patterning SOG, polymide, or polysilane to avoid harm to the self-patterning metal oxide. As with the other processes described herein, this process can be used in combination with any of the processes described above or below to fabricate an integrated circuit. In FIG. 36 an active ferroelectric/dielectric layer 176 has been deposited and patterned on a substrate 175 including an insulator 172 and bottom electrode 174 as discussed in reference to FIG. 16 and steps P206 through P212 in FIG. 52. Then, in FIG. 37 a layer of self-patterning insulator 180 has been deposited. The insulator 180 is preferably photo-sensitive SOG, put also may be a photosensitive polymide, polysilane, or other photosensitive insulator. The photosensitive SOG solution described in extended abstracts (The 39th Spring Meeting, 1992) 28a -N.B-7, The Japan Society of Applied Physics and Related Societies, may be used. If a photopolymide is used, a process as described in the Proceedings of the 2nd SPE International Conference on Polymides, Ellenville, N.Y., October–November, 1985, may be used. If a photosensitive polysilane is used, a process as described in the Proceedings of the SPIE, 469, 16 (1984) may be used. Alternatively, any of the four types of photosensitive solutions described above may be used with appropriate amounts of silicon, polymide or polysilane in the solutions as described in the references given above. The photosensitive SOG or other solution is deposited by spin deposition as described above, pre-baked, masked, exposed to UV radiation, and developed as described in reference to FIG. 52 to produce the silicon holes 182. Preferably the development solvent is 2-methoxyethanol, isopropyl alcohol (IPA) or other appropriate solvent. These solvents do not harm the already developed ferroelectric/dielectric 176 film. Thus, this process also protects the layer 176 from a harsh etch, such as hydrofloric acid. The ferroelectric/dielectric layer 176 and the SOG are then dried and annealed as described with respect to steps P216 and P218 in FIG. 52. Alternatively, the ferroelectric/dielectric layer 176 may be completed through the drying step P216, or through the drying and anneal steps P216 and P218, before deposition of the SOG or other insulator. The subsequent steps of deposition of the top electrode layer 184 and the patterning of top electrode 186 and metalization portion 187 are the same as the steps described in relation to FIGS. 34 and 35, and the masks are the same also, and thus will not be repeated. After the deposition of layer 184, the active layer 176 is completely enclosed by the substrate 188 on which it was formed, i.e. bottom electrode 174 and dielectric 172, and ILD 180, and top electrode 186, and therefore is protected from any harsh IC processing steps. Thus, the process of FIGS. 31–35 also ensures that the active layer 176 is never exposed to harsh conventional IC processing steps throughout the entire fabrication process.

Figure 41:
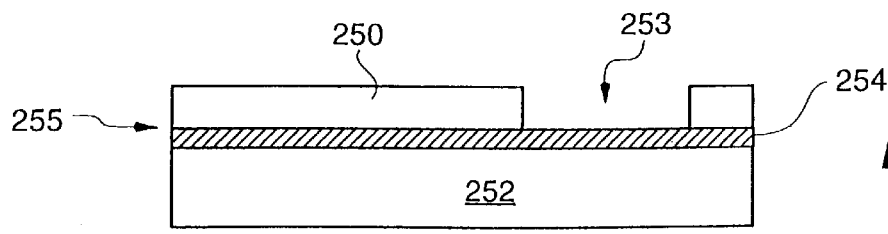
FIGS. 41–47 illustrate various stages in a method according to the invention of making a capacitor utilizing a self-patterning material in an $SiO_2$ hole, which method may be utilized in making the integrated circuit capacitors of FIGS. 5, 11 and 14.
Figure 42:
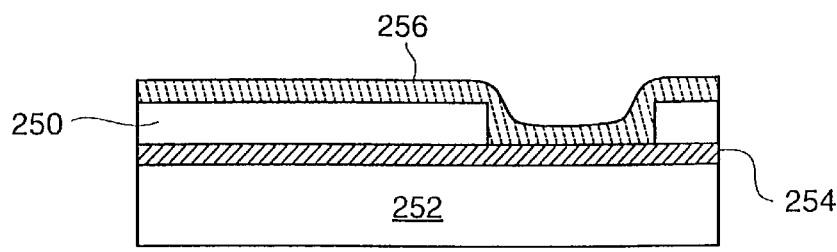
Figure 43:
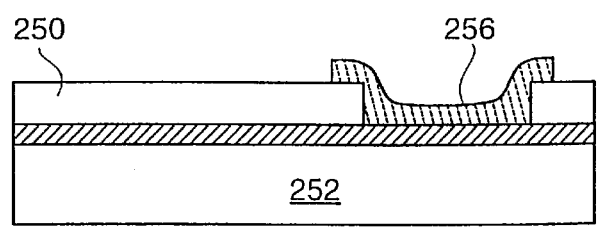
Figure 44:
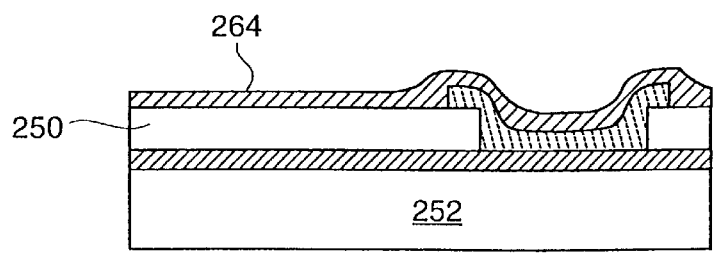
Figure 45:
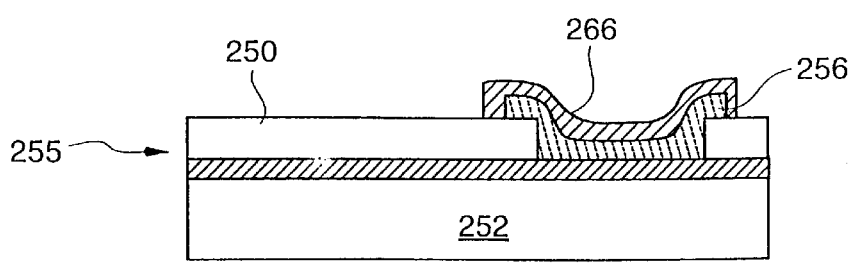
Figure 46:
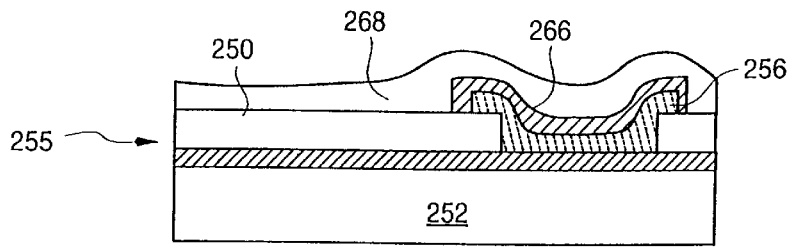
Figure 47:
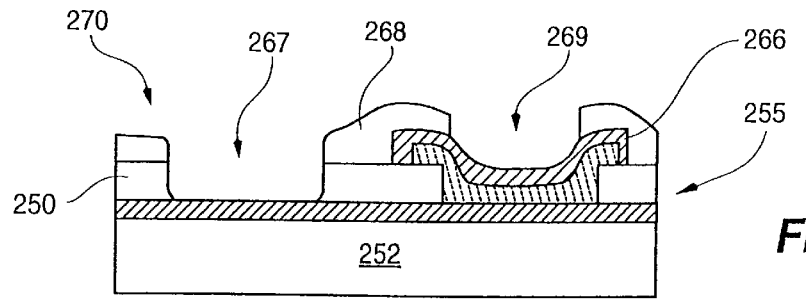

Turning to FIGS. 41–47 a process in which the self-patterned active ferroelectric/dielectric layer 256 (FIG. 43) is formed in an SiO$_2$ hole (via) 253 (FIG. 41) is illustrated. This process can be used in combination with any of the other structures and/or processes discussed herein to fabricate an integrated circuit. It is similar to the structure and process utilized in the capacitors 310, 312 of FIG. 57. In FIG. 41 a bottom electrode 254 has been formed and patterned on an insulator 252 to form a substrate 255 as described with reference to FIG. 16 above, followed by the deposition of an ILD layer 250. Layer 250 is preferably SOG, but also may be other forms of silicon dioxide, silicon nitride, or other suitable insulator. It is formed by any conventional method of making such material. An "SiO$_2$ hole" or "via" 253, which in the art is terminology for a hole in an insulator, is formed in the insulator 250. Then a photosensitive ferroelectric/dielectric layer 256 is deposited as described above with respect to step P206 in FIG. 52 to obtain the result of FIG. 42. As indicated above, the material 256 was preferably strontium bismuth tantalate, but may be other layered superlattice materials or metal oxides. The layer 256 is then patterned as described with respect to steps P208–P212 in FIG. 52, then dried and annealed as described with respect to steps P216 and P218 in FIG. 52. Then a layer 264 of platinum, platinum/titanium, or other suitable top electrode material, preferably about 2000 Å of platinum, is deposited, preferably by sputtering as shown in FIG. 44. Then the layer 264 is patterned by a conventional resist, mask, photo, develop, ion milling, and strip steps to form the top electrode 266, as shown in FIG. 45. Then, a silicon dioxide or other insulator layer 268, preferably SOG, is deposited as indicated in FIG. 46. Holes 267 and 269 are then formed in insulator layers 268 and 250, preferably by a wet etch with HF and NH$_4$F, but which could be formed by other suitable etch processes, to yield the wafer 270 as shown in FIG. 47. As in the other examples given above, the integrated circuit 270 is then preferably completed as discussed above. The mask overlay horizontal dimensions may be derived from the above FIGS. 41–47; the vertical size of the mask elements are as essentially as shown in FIGS. 22 and 30 for corresponding elements, i.e. the mask for the hole 269 is nested within the mask for the ferroelectric/dielectric material 256, which is nested within the mask for the top electrode 266.

A review of the above process shows it also avoids any exposure of active layer 256 to harsh IC fabrication processes. The SiO$_2$ etch is performed prior to the deposition of layer 256. Immediately after the formation of active layer 256, top electrode 266 is formed so that active layer 256 is completely enclosed by substrate 255, ILD 250 and platinum top electrode 266. Therefor it is not directly exposed to any subsequent IC processes.

Figure 48:
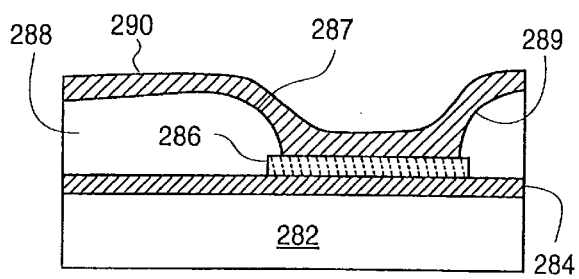
FIGS. 48 and 49 illustrate a chemical mechanical polishing process that may be used in combination with several of the processes illustrated in the above FIGS.
Figure 49:
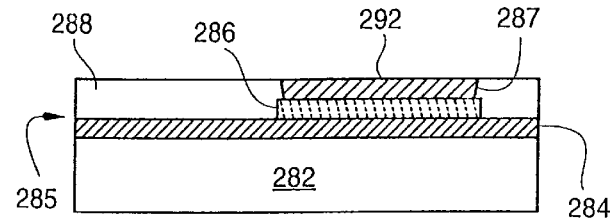

In FIGS. 48 and 49 a chemical mechanical polishing (CMP) process is shown. In FIG. 48, a bottom electrode 284 has been formed on an insulator 282 to form a substrate 285 on which a ferroelectric/dielectric self-patterning active material 286 has been deposited, patterned, and annealed as described above in the other examples. A thick layer of oxide 288, which may be any suitable insulator but is preferably self-patterned silicon dioxide, has been formed, and a hole 287 formed in the development process. Then, a top electrode material 290, which is preferably about 2200 Å of platinum, but may be other suitable electrode material or materials, is deposited in hole 287. Then, a CMP polishing step, which is known in the art, is performed to provide the top electrode 292 of about 2000 Å thickness as shown in FIG. 49. This CMP process may be used in combination with any of the processes and structures discussed above or below to fabricate an integrated circuit For example, it may be used as an alternative series of steps to pattern the top electrode in any of the processes described above. If used in combination with some processes, such as the process of FIGS. 41–47, then the insulator 288 would be deposited before the active layer 286. As in the other processes, the CMP process described results in the active layer 286 being completely enclosed by substrate 285, insulator 288, and top electrode substance 292 before any harsh processing steps are performed that can harm it.

Figure 50:
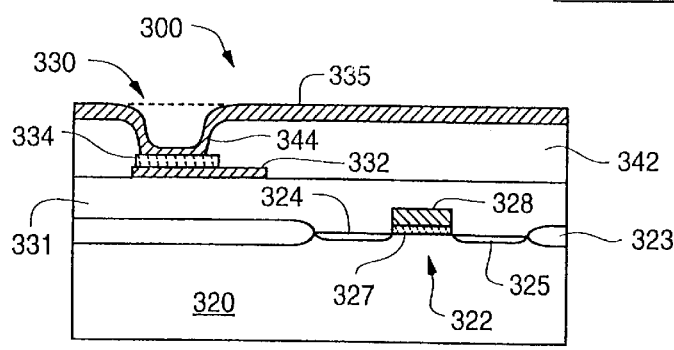
FIGS. 50 and 51 illustrate a chemical mechanical polishing process similar to that of FIGS. 48 and 49 used in the fabrication of a memory cell.
Figure 51:
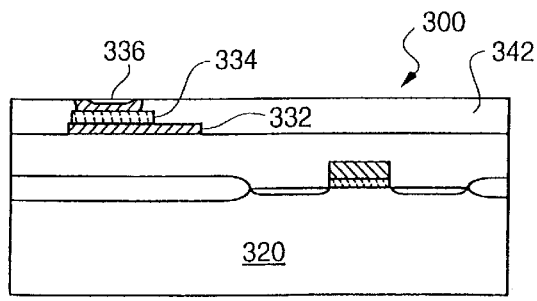

In FIGS. 50 and 51 another CMP process is shown. This is similar to the process of FIGS. 48 and 49 except that the capacitor 330 is formed on an interlayer dielectric 331 that covers a transistor 322 formed on substrate 320. As in the other embodiments, transistor 322 includes active areas 324 and 325, gate oxide 327 and gate 328, which are all made as for example described in reference to FIGS. 1–5 above. Capacitor 330 includes bottom electrode 332 and ferroelectric/dielectric layer 334, which are made as described in reference to FIGS. 8–11 above. After the ferroelectric/dielectric layer 334 is patterned, another interlayer dielectric 342 is formed, which is preferably silicon dioxide deposited in a CVD process or spin-on-glass, though it may be silicon nitride or other suitable insulator. Then a hole 344 is formed, preferably by a conventional photomask and etch process. An approximately 2000 Å thick layer 335 is then deposited, which is preferably platinum, but may be other suitable metals that do not adhere well to insulator 342. Then, a CMP polishing step, which is known in the art, is performed to provide the top electrode 336 of about 2000 Å thickness as shown in FIG. 51. This CMP process may be used in combination with the processes and structures discussed above or below which include a transistor to fabricate an integrated circuit.

A feature of the processes of FIGS. 48 to 51 is that the characteristic of platinum to peel away from a substrate such as silicon oxide and silicon nitride unless it has an adhesion layer, which is usually a negative characteristic, is used in a positive way. That is, the platinum lifts away from the ILD 288, 342 with simple brushing or scrubbing and is totally cleaned away in the course of the CMP process. The platinum tends to adhere to a metal oxide 286, 334, such as a layered superlattice material, thus this process is a very simple and quick way to form the upper electrode 292, 336.

It is a feature of the process and circuit of FIGS. 41–47 that ferroelectric/dielectric material 256 overlaps the edges 277 of via 253 after patterning. The material 256 usually tends to shrink during anneal, and this overlap prevents material deposited in the top electrode deposition from extending through the via 253 and causing shorting between the top electrode 266 and the bottom electrode 254. It is a further feature of the process and circuit of FIGS. 41–47 that ferroelectric/dielectric material 256 is completely enclosed by bottom electrode 254, insulator 250 and top electrode 266. As indicated above, this protects the material 256 from subsequent processing prior to the deposition of a passivation layer. Similarly, it is evident that in the processes of FIGS. 48–51 the outer circumference of hole 289, 344 is within the outer circumference of active layer 286, 334. Thus if hole 289, 344 is considered a "via" the active layer 286, 334 overlaps the via and prevents shorting in case of any shrinkage of active layer 286, 334 during the anneal, which may particularly occur if insulator 288,342 and active layer 286, 334 are annealed together.

2B. The Fabrication of the Protective Layer

The protective/sacrificial layers 40, 40A, 40B and 40C are preferably made by a liquid source deposition process.

Protective layers 40, 40A, and 40B may be made either utilizing a conventional photo mask and etch patterning process or a self-patterning process. Since FIG. 10 specifically refers to a self-patterning process, layer 40C is made by such a process. If the protective/sacrificial layer is made using a conventional photo mask and etch patterning process, then the preferred method of making it is the process for making metal oxides described in U.S. Pat. No. 5,514,822 issued May 7, 1996 which is hereby incorporated by reference as though fully disclosed herein. If the protective/sacrificial layer is made using a self-patterning process, then the preferred method of making it is the process shown in and described in connection with FIG. 52 above. Two examples of the preferred solutions for use in the self-patterning process follow and how these solutions are used in the self-patterning process of FIG. 52 to make a sacrificial/protective layer 40, 40A, 40B, and 40C are given below. The solutions may, alternatively, be used in making the ferroelectric/dielectric layer such as 34, 34A–34D, 106, 126, 156, 176, 256, 286, 334, and 434 of a capacitor.

EXAMPLE 6

This example describes the making of a 0.13M metal-alkoxycarboxylate photo precursor solution designed to yield an $ABO_3$ type high dielectric constant metal oxide, namely strontium bismuth tantalate having the formula $Sr_{1.0}Ta_{2.0}O_{9.1}$. This is a preferred material to use in the protective layer 40, 40A, 40B, and 40C.

TABLE 6

| Ingredient | FW (g/mol) | Grams | mmole | Equiv. |
| --- | --- | --- | --- | --- |
| Tantalum (V) ethoxide | 406.25 | 16.259 | 40.0 | 2.0 |
| 1-methoxy-2-propanol | 90.12 | 40 ml | 408 | — |
| 2-ethylhexanoic acid | 144.21 | 30.0 | 208.0 | — |
| Strontium | 87.62 | 1.752 | 20.0 | 1.0 |

An Erlenmeyer flask equipped with a reflux condenser was used to combine the strontium (1.752 g) for reaction with a large excess amount (40 ml) of 1-methoxy-2-propanol to form a reaction mixture. Tantalum (V) ethoxide (16.25 g) was combined with the reaction mixture. The reaction mixture was refluxed with magnetic stirring at 120° C. for three hours to dissolve and react the strontium metal with the 1-methoxy-2-propanol. The 2-ethylhexanoic acid (30.0 g) was added to the hot reaction mixture, which was again refluxed at 130 ° C. for an additional three hours. This second refluxing assisted an exothermic substitution of 2-ethylhexanoate ligands for alkoxide ligands on the respective metals, which produced metal alkoxycarboxylates. The reacted solution was evaporated at a temperature ranging from 50° C. to 110° C. under aspiration vacuum to remove about 15 ml of solvent. The solution stood for cooling to room temperature. Nitro benzaldehide (2.5 g) was added along with sufficient 1-methoxy-2-propanol to adjust the solution yield to 0.13 mmol of $Sr_{1.0}Ta_{2.0}O_{9.1}$ per Kg.

This solution was then used to deposit a protective/sacrificial layer 40C as described above in connection with steps P206 through P218 of FIG. 52 above. The spinning, pre-bake, UV irradiation, post-bake, development, dry, repeat step 214, and anneal parameters were as described in Example 5.

EXAMPLE 7

This example describes the making of an 0.14M metal-alkoxycarboxylate photo precursor solution designed to yield a layered superlattice high dielectric constant metal oxide, namely bismuth deficient strontium bismuth tantalate having the formula $Sr_{0.90}Bi_{1.9}Ta_{2.0}O_{9.1}$. This is another preferred material to use in the protective layer 40, 40A, 40B, and 40C.

TABLE 7

| Ingredient | FW (g/mol) | Grams | mmole | Equiv. |
| --- | --- | --- | --- | --- |
| Tantalum (V) ethoxide | 406.25 | 12.18 | 30.0 | 2.0 |
| 1-methoxy-2-propanol | 90.12 | 40 ml | 408 | — |
| 2-ethylhexanoic acid | 144.21 | 30.0 | 208.0 | — |
| Strontium | 87.62 | 1.58 | 18.0 | 0.90 |
| Bismuth 2-ethylhexanoate (in 22% 1-methoxy-2-propanol) | 949.77 | 36.09 | 38.0 | 1.9 |

An Erlenmeyer flask equipped with a reflux condenser was used to combine the strontium (1.58 g) for reaction with a large excess amount (40 ml) of 1-methoxy-2-propanol to form a reaction mixture. Tantalum (V) ethoxide (12.18 g) was combined with the reaction mixture. The reaction mixture was refluxed with magnetic stirring at 120° C. for three hours to dissolve and react the strontium metal with the 1-methoxy-2-propanol. The 2-ethylhexanoic acid (30.0 g) was added to the hot reaction mixture, which was again refluxed at 130° C. for an additional three hours. This second refluxing assisted an exothermic substitution of 2-ethylhexanoate ligands for alkoxide ligands on the respective metals, which produced metal alkoxycarboxylates. The reacted solution was evaporated at a temperature ranging from 50° C. to 120° C. under aspiration vacuum to remove about 15 ml of solvent. The solution stood for cooling to room temperature. The bismuth-2-ethylhexanoate (36.09 g) and nitro benzaldehide (2.5 g) was added along with sufficient 1-methoxy-2-propanol to adjust the solution yield to 0.13 mmol of $Sr_{0.90}Bi_{1.9}Ta_{2.0}O_{9.1}$ per Kg.

This solution was then used to deposit a protective/sacrificial layer 40 as described above in connection with steps P206 through P218 of FIG. 52 above. The spinning, pre-bake, UV irradiation, post-bake, development, dry, repeat step 214, and anneal parameters were as described in Example 5.

A feature of the Examples 4, 6 and 7 above is the use of 1-methoxy-2-propanol as a solvent. This solvent is a relatively safe solvent as compared to 2-methoxyethanol, for example, that previously was used. Yet it has been found to be equally if not more effective than the less environmentally desirable solvents.

There has been described a novel, compact, integrated circuit structure in which a layered superlattice material or other active layer is protected from other process steps, a process for fabricating an integrated circuit utilizing a protective layer compatible with layered superlattice materials, as well as other novel features and combinations of features applicable to integrated circuits. While this structure and process have been described in terms of what is at present considered to be the preferred embodiments of the invention, it will be understood that the invention can be embodied in other specific forms without departing from its spirit or essential characteristics. Now that a process for fabricating an integrated circuit incorporating these materials and the IC structure itself, the alternative ways of fabricating the structures, and the many other features and of the process and circuit have been disclosed, many modifications and variations of the disclosed structures and processes and the principles underlying them may be devised. The present embodiments are, therefore, to be considered as illustrative and not restrictive. The scope of the invention is indicated by the appended claims.

We claim:

1. A ferroelectric integrated circuit comprising, a ferroelectric device; a protective sacrificial layer overlying said ferroelectric device; and a wiring element; said protective sacrificial layer comprising a self-patterned material; and said protective sacrificial layer completely overlying said ferroelectric device except for a minor portion which is removed to permit said wiring element to penetrate said sacrificial layer to make contact with said ferroelectric device.

2. A ferroelectric integrated circuit comprising:

a semiconducting substrate defining a substrate plane;

a transistor formed on said substrate, said transistor including an active area and a transistor gate;

an insulating layer overlying said transistor gate;

a conducting plug passing through said insulating layer to said active area and extending farther from said substrate plane than said transistor gate;

a ferroelectric device, said ferroelectric device having a ferroelectric layer and making electrical contact with said conducting plug and completely overlying both said conducting plug and said active area;

a protective sacrificial layer for protecting said ferroelectric device from all reducing processes subsequent to formation of said ferroelectric layer; and a wiring element passing through said protective layer and making electrical contact with said ferroelectric device;

said protective sacrificial layer completely overlying said ferroelectric device except for a minor portion which is removed to permit said wiring element to penetrate said sacrificial layer.

3. A ferroelectric integrated circuit as in claim 2 wherein said ferroelectric layer completely underlies said protective sacrificial layer.

4. A ferroelectric integrated circuit as in claim 2 wherein said ferroelectric device comprises a ferroelectric capacitor having a bottom electrode, a top electrode, and a ferroelectric material between said electrodes, and wherein said bottom electrode is enclosed by said ferroelectric layer, said insulating layer, and said conducting plug.

5. A ferroelectric integrated circuit as in claim 2 wherein said integrated circuit includes a memory cell and said protective sacrificial layer completely overlies said memory cell except for a minor portion which is removed to permit an electrical contact to penetrate said protective sacrificial layer to make contact with said memory cell.

6. A ferroelectric integrated circuit comprising:

a semiconducting substrate defining a substrate plane;

a memory cell formed on said substrate, said memory cell comprising a transistor and a ferroelectric device;

said transistor including an active area;

said ferroelectric device including a ferroelectric layer that completely overlies said transistor except for a minor portion which is removed to permit an electrical contact to penetrate said ferroelectric layer to make contact with said transistor; and said electrical contact comprising a wiring element passing through said ferroelectric layer and making electrical contact with said active area.

7. A ferroelectric integrated circuit as in claim 6 and further including a protective sacrificial layer completely overlying said ferroelectric layer except for minor portions which are removed to permit electrical contacts to penetrate said protective sacrificial layer to make contact with said memory cell.

8. A ferroelectric integrated circuit comprising: a ferroelectric device having a ferroelectric layer; a protective sacrificial layer overlying said ferroelectric layer for protecting said ferroelectric layer from all reducing processes subsequent to formation of said ferroelectric layer; and a wiring element passing through said protective layer and making electrical contact with said ferroelectric device; said protective sacrificial layer comprising a material selected from the group consisting of: a) a metallic compound comprising a metal selected from a first metal group consisting of tantalum, hafnium, tungsten, niobium and zirconium; b) a metallic compound comprising one or more metals selected from a second group of metals consisting of titanium, tantalum, hafnium, tungsten, niobium and zirconium compounded with one or more metals from a third group of metals consisting of strontium, calcium, barium, bismuth, cadmium, and lead.

9. A ferroelectric integrated circuit as in claim 8 wherein said material comprises a compound selected from the group consisting of strontium tantalate, tantalum oxide, bismuth deficient strontium bismuth tantalate, strontium titanate, strontium zirconate, strontium niobate, tantalum nitride, and tantalum oxynitride.

10. A ferroelectric integrated circuit as in claim 8 wherein said material is a self-patterned material.

* * * * *